(12) United States Patent
Cho et al.

(10) Patent No.: US 7,768,000 B2
(45) Date of Patent: Aug. 3, 2010

(54) THIN FILM TRANSISTOR ARRAY PANEL AND MANUFACTURING METHOD THEREOF

(75) Inventors: Seung-Hwan Cho, Hwaseong-si (KR); Bo-Sung Kim, Seoul (KR); Keun-Kyu Song, Yongin-si (KR); Tae-Young Choi, Seoul (KR); Min-Ho Yoon, Seoul (KR); Jung-Hun Noh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 350 days.

(21) Appl. No.: 11/864,581

(22) Filed: Sep. 28, 2007

(65) Prior Publication Data

US 2008/0078993 A1    Apr. 3, 2008

(30) Foreign Application Priority Data

Sep. 29, 2006 (KR) .................. 10-2006-0095859
Jul. 18, 2007 (KR) .................. 10-2007-0071639

(51) Int. Cl.
*H01L 35/24* (2006.01)
*H01L 51/00* (2006.01)

(52) U.S. Cl. .............. 257/40; 257/59; 257/72; 257/E51.001; 349/147; 349/148

(58) Field of Classification Search .......... 257/40, 257/59, 72; 349/147, 148
See application file for complete search history.

(56) References Cited

U.S. PATENT DOCUMENTS

2005/0071969 A1* 4/2005 Sirringhaus et al. .......... 29/4.51
2006/0272942 A1* 12/2006 Sirringhaus ................ 204/406
2007/0254402 A1* 11/2007 Dimmler et al. ............. 438/99

FOREIGN PATENT DOCUMENTS

| JP | 2004-356538 | 12/2004 |
|----|-------------|---------|
| JP | 2005-072495 | 3/2005 |
| JP | 2006-147613 | 6/2006 |
| JP | 2006-261517 | 9/2006 |
| JP | 2006-303459 | 11/2006 |
| KR | 1020070000668 | 1/2007 |

* cited by examiner

*Primary Examiner*—Kenneth A Parker
*Assistant Examiner*—Anthony Ho
(74) *Attorney, Agent, or Firm*—Innovation Counsel LLP

(57) ABSTRACT

A manufacturing method for a thin film transistor array panel including forming a gate electrode, forming an insulating layer on the gate electrode, sequentially forming a lower conducting layer and a upper conducting layer on the insulating layer, etching the upper conducting layer to form a first source electrode and a first drain electrode, etching the lower conducting layer to form the second source electrode and the second drain electrode, over-etching the second source electrode and the second drain electrode, and forming an organic semiconductor between the second source electrode and the second drain electrode.

10 Claims, 31 Drawing Sheets

THIN FILM TRANSISTOR ARRAY PANEL AND MANUFACTURING METHOD THEREOF

CROSS-REFERENCE TO RELATED APPLICATION

This application claims priority to and the benefit of Korean Patent Application Nos. 10-2006-0095859 filed in the Korean Intellectual Property Office on Sep. 29, 2006 and 10-2007-0071639 filed in the Korean Intellectual Property Office on Jul. 18, 2007, the entire contents of which are incorporated herein by reference.

BACKGROUND OF THE INVENTION

1. Field of the Invention

The present invention relates to a thin film transistor array panel and a manufacturing method thereof.

2. Description of the Related Art

Flat panel displays, such as a liquid crystal display, an organic light emitting device, and an electrophoretic display include several pairs of field generating electrodes interposed with electro-optical active layers. The liquid crystal display includes a liquid crystal layer as the electro-optical active layer, and an organic light emitting device includes an organic emission layer as the electro-optical active layer.

One electrode of a pair of field generating electrodes, i.e., a pixel electrode, is commonly connected to a switching element to receive data signals while the electro-optical active layer converts the electrical signals to optical images.

Thin film transistors having three terminals are used as switching elements in a flat panel display, and the flat panel display includes gate lines for transmitting gate signals to control the thin film transistors and data lines for transmitting signals to be applied to pixel electrodes.

Among thin film transistors, organic thin film transistors using an organic semiconductor instead of an inorganic semiconductor such as silicon (Si) have been vigorously researched.

The organic thin film transistor may be fabricated by a solution process such as inkjet printing, and therefore the organic thin film transistor may be easily applied to a large-sized flat panel display. However, the organic thin film transistor has a different structure and different manufacturing process from other thin film transistors. Accordingly, it may be necessary to compromise the fabrication process for the organic semiconductor in order to obtain the desired characteristics for the thin film transistor included in the display.

SUMMARY OF THE INVENTION

The present invention, according to one aspect, provides a thin film transistor array panel having an organic semiconductor made by an improved manufacturing process.

A thin film transistor array panel according to an embodiment of the present invention includes a gate electrode, an insulating layer formed on the gate electrode, an organic semiconductor formed on the insulating layer, a source electrode and a drain electrode formed on the organic semiconductor and disposed opposite each other, and a pixel electrode connected to the drain electrode. The source electrode and the drain electrode include a first source electrode and a first drain electrode disposed opposite each other with a first interval therebetween, and a second source electrode and a second drain electrode disposed opposite each other with a second interval therebetween.

The organic semiconductor may be disposed between the second source electrode and the second drain electrode.

The second source electrode and the second drain electrode may be over-etched as compared with the first source electrode and the first drain electrode.

The thin film transistor array panel may further include a bank formed on the first source electrode and the first drain electrode and having a first opening exposing the organic semiconductor.

The thin film transistor array panel may further include a passivation layer disposed in the first opening.

The thin film transistor array panel may further include a gate line connected to the gate electrode, a data line connected to the source electrode, and a organic layer having substantially the same planar shape as the data line, the source electrode, and the drain electrode, and disposed between the bank and the data line, between the bank and the source electrode, and between the bank and the drain electrode.

The insulating layer may have a second opening exposing the gate electrode, and the thin film transistor array panel may further include a gate insulator formed in the second opening.

The first source electrode and the first drain electrode may include ITO, and the second source electrode and the second drain electrode may include a metal.

The thin film transistor array panel may further include a third source electrode and a third drain electrode formed on the first source electrode and the first drain electrode, and the third source electrode and the third drain electrode may include a metal having a different etching ratio from that included in the second source electrode and the second drain electrode.

The second source electrode and the second drain electrode may include molybdenum, and the third source electrode and the third drain electrode may include chromium.

A manufacturing method for a thin film transistor array panel according to an embodiment of the present invention includes forming a gate electrode, forming an insulating layer on the gate electrode, sequentially forming a lower conducting layer and a upper conducting layer on the insulating layer, etching the upper conducting layer to form a first source electrode and a first drain electrode, etching the lower conducting layer to form the second source electrode and the second drain electrode, over-etching the second source electrode and the second drain electrode, and forming an organic semiconductor between the second source electrode and the second drain electrode.

The manufacturing method may further include forming a bank having a first opening on the first source electrode and the first drain electrode, and the formation of the organic semiconductor may be performed by dripping an organic semiconductor solution through the first opening.

The manufacturing method may further include forming a second opening exposing the gate electrode in the insulating layer after the etching of the lower conducting layer.

The formation of the second opening may be performed by over-etching the insulating layer.

The manufacturing method may further include forming a gate insulator in the second opening after the formation of the bank.

The manufacturing method may further include forming a passivation layer in the first opening after formation of the organic semiconductor.

A manufacturing method for a thin film transistor array panel according to another embodiment of the present invention includes forming a gate electrode, forming an insulating layer on the gate electrode, sequentially forming a lower conducting layer and an upper conducting layer on the insulating layer, etching the upper conducting layer to form a first source electrode and a first drain electrode, etching the lower conducting layer to form the second source electrode and the second drain electrode, over-etching the insulating layer to form a first opening exposing the gate electrode, forming a bank having a second opening exposing a portion of the first opening on the first source electrode and the first drain electrode, and forming a gate insulator in the first opening.

The manufacturing method may further include over-etching the second source electrode and the second drain electrode after the formation of the gate insulator, and forming an organic semiconductor between the second source electrode and the second drain electrode.

The manufacturing method may further include forming a passivation layer in the second opening after formation of the organic semiconductor.

DETAILED DESCRIPTION OF THE EMBODIMENTS

Figure 1:
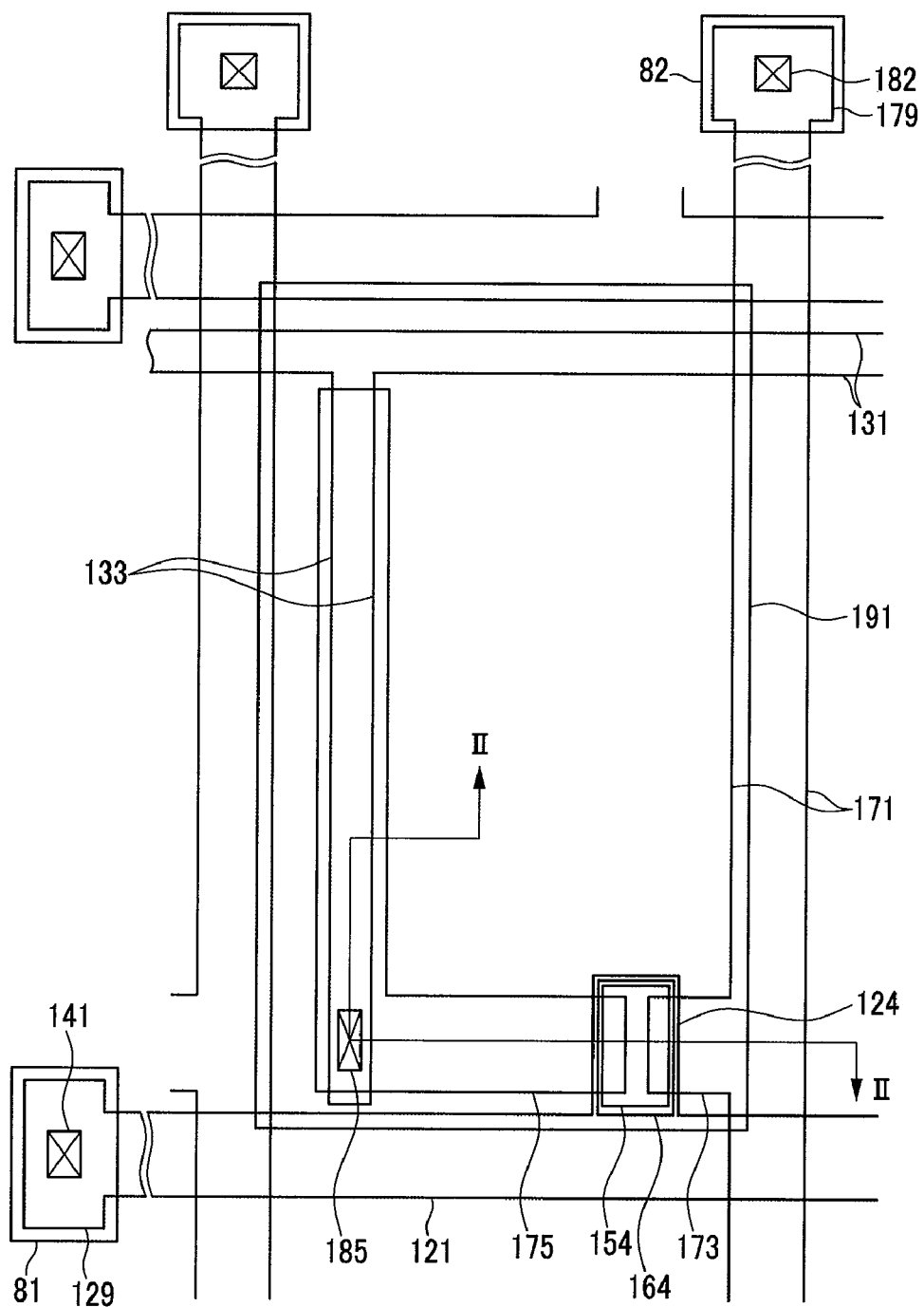
FIG. 1 is a layout view of a thin film transistor array panel according to an embodiment of the present invention.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A thin film transistor array panel according to an embodiment of the present invention will be described in detail with reference to FIG. 1 and FIG. 2.

Figure 2:
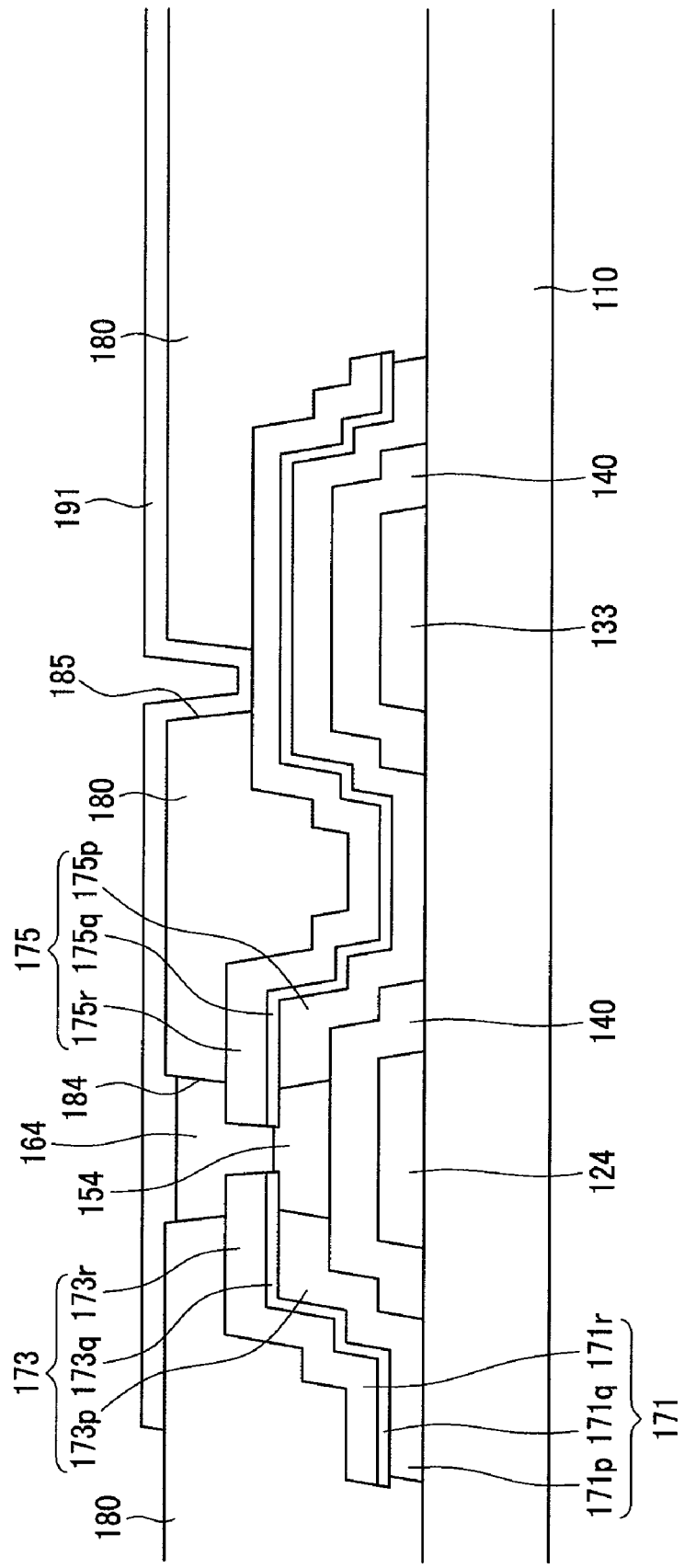
FIG. 2 is a sectional view of the thin film transistor array panel shown in FIG. 1 taken along the line II-II.

FIG. 1 is a layout view of a thin film transistor array panel according to an embodiment of the present invention, and FIG. 2 is a sectional view of the thin film transistor array panel shown in FIG. 1 taken along the line II-II.

A plurality of gate lines 121 and a plurality of storage electrode lines 131 are formed on an insulating substrate 110 made of a material such as transparent glass, silicone, or plastic.

The gate lines 121 transmit gate signals and extend substantially in a transverse direction. Each gate line 121 includes a plurality of gate electrodes 124 projecting upward and an end portion 129 having a large area for contact with another layer or an external driving circuit.

The storage electrode lines 131 are supplied with a predetermined voltage and extend substantially parallel to the gate lines 121. Each of the storage electrode lines 131 is disposed between two adjacent gate lines 121 and includes a storage electrode 133 expanding upward and downward. However, the storage electrode lines 131 may have various shapes and arrangements.

An interlayer insulating layer 140 is formed on the gate lines 121 and the storage electrode lines 131. Portions of the interlayer insulating layer 140 disposed on the gate electrodes 124 function as a gate insulator.

A plurality of data lines 171 and a plurality of drain electrodes 175 are formed on the interlayer insulating layer 140.

The data lines 171 transmit data signals and extend substantially in the longitudinal direction. Each data line 171 includes a plurality of source electrodes 173 projecting toward the gate electrodes 124 and an end portion 179 having a large area for contact with another layer or an external driving circuit.

The data lines 171 have a triple-layered structure including lower data lines 171p including lower source electrodes 173p and lower end portions 179p, middle data lines 171q including middle source electrodes 173q and middle end portions 179q, and upper data lines 171r including upper source electrodes 173r and upper end portions 179r.

The lower data lines 171p, the middle data lines 171q, and the upper data lines 171r have substantially the same planar shape as each other, but the lower data lines 171p may have a narrower width than that of the middle data lines 171q and upper data lines 171r by being over-etched in a manufacturing method described below.

Each drain electrode 175 includes a portion disposed opposite the source electrode 173 and a portion extending upward to overlap the storage electrode 133. The drain electrodes 175 have a triple-layered structure including lower drain electrodes 175p, middle drain electrodes 175q, and upper drain electrodes 175r.

The lower drain electrodes 175p, the middle drain electrodes 175q, and the upper drain electrodes 175r have substantially the same planar shape as each other, but the drain electrodes 175p may have a narrower width than that of the middle drain electrodes 175q and the upper drain electrodes 175r by being over-etched in a manufacturing method described below.

The middle source electrodes 173q are disposed opposite the middle drain electrodes 175q with a first gap therebetween, and the upper source electrodes 173r are disposed opposite the upper drain electrodes 175r with the first gap therebetween. The lower source electrodes 173p are disposed opposite the lower drain electrodes 175p with a second gap therebetween that is larger than the first gap.

The lower data lines 171p, the lower drain electrodes 175p, the upper data lines 171r, and the upper drain electrodes 175r may be made of a low resistivity metal such as chromium (Cr), molybdenum (Mo), tantalum (Ta), and titanium (Ti) to prevent a signal delay. The upper data lines 171r and the upper drain electrodes 175r simultaneously function as supporters for supporting the middle data lines 171q and middle drain electrodes 175q, and they may be omitted.

Particularly, the lower data lines 171p and the lower drain electrodes 175p are made of a metal having a different etching ratio from the upper data lines 171r and the upper drain electrodes 175r. For example, the lower data lines 171p and the lower drain electrodes 175p may be made of molybdenum (Mo), and the upper data lines 171r and the upper drain electrodes 175r may be made of chromium (Cr).

The middle data lines 171q and the middle drain electrodes 175q may be made of a transparent conductive material such as ITO or IZO. The middle source electrodes 173q and the middle drain electrodes 175q directly contact an organic semiconductor 154 described below, so that they may be made of material having a similar work function as the organic semiconductor 154. The middle source electrodes 173q and the middle drain electrodes 175q simultaneously function as ohmic contacts for reducing Schottky barriers between the organic semiconductors 154 and the electrodes.

A plurality of organic semiconductors 154 are formed between the lower source electrodes 173p and the lower drain electrodes 175p. The organic semiconductors 154 are disposed over the gate electrodes 124. The organic semiconductors 154 have substantially the same thickness as the lower source electrodes 173p and the lower drain electrodes 175p, so the thickness of the organic semiconductor 154 may be adjusted according to the thickness of the lower source electrodes 173p and the lower drain electrodes 175p.

The lateral sides of the organic semiconductors 154 are contacted to the lower source electrodes 173p and the lower drain electrodes 175p, respectively, and the upper side of the organic semiconductors 154 is contacted to the middle source electrodes 173q and the middle drain electrodes 175q.

The organic semiconductor islands 154 may include a high molecular compound or a low molecular compound that is soluble in an aqueous solution or an organic solvent, and may be formed by an inkjet printing method. However, the organic semiconductors 154 may be made by another solution process such as spin coating and slit coating, or a deposition method, etc.

The organic semiconductor islands 154 may be made of polythienylenevinylene, poly 3-hexylthiophene, polythiophene, phthalocyanine, metallized phthalocyanine, or their halogenated derivatives. The organic semiconductor islands 154 may be made of perylenetetracarboxylic dianhydride (PTCDA), naphthalenetetracarboxylic dianhydride (NTCDA), or their imide derivatives. The organic semiconductor island 154 may be made of perylene, coronene, or derivatives thereof with a substituent.

A gate electrode 124, a source electrode 173, and a drain electrode 175 along with an organic semiconductor 154 form a thin film transistor having a channel formed in the organic semiconductor 154 disposed between the source electrode 173 and the drain electrode 175.

A bank 180 is formed on the data lines 171 and the drain electrodes 175. The bank 180 is made of a photosensitive organic material that is suitable for the solution process, and has a thickness of about 5,000 Å to 4 μm. The bank 180 has a plurality of openings 184 exposing the organic semiconductors 154 and a plurality of contact holes 185 exposing portions of the drain electrodes 175.

A plurality of passivation layers 164 are formed on the openings 184 of the bank 180. The passivation layers 164 may be made of an insulating material such as a fluoride based calcium hydrogen compound or a polyvinyl alcohol based compound, and the passivation layers 164 protect the organic semiconductors 154 from external heat, plasma, and chemical materials. The openings 184 have a size that is large enough to make the surface of the passivation layers 164 flat.

A plurality of pixel electrodes 191 and a plurality of contact assistants 81 and 82 are formed on the bank 180 and the passivation layers 164.

The pixel electrodes 191 are connected to the drain electrodes 175 through the contact holes 185, and receive data voltages from the drain electrodes 175 of the thin film transistors. A pixel electrode 191 overlaps the storage electrode 133 to increase storage capacitance, and here the overlapping area between the drain electrodes 175 and the storage electrodes 133 is broadened as shown in FIG. 1 and FIG. 2 to prevent the storage capacitance from reducing due to the thickness of the bank 180 disposed between the pixel electrodes 191 and the storage electrodes 133.

The contact assistants 81 and 82 are connected to the end portions of the gate lines 121 and the end portions of the data lines 171 through contact holes 141 and 182, respectively. The contact assistants 81 and 82 protect the end portions 129 and 179 and enhance the adhesion between the end portions 129 and 179 and external devices such as a driver IC.

The pixel electrodes 191 and the contact assistants 81 and 82 may be made of a transparent conductive material or a reflective metal.

Now, a manufacturing method of the thin film transistor shown in FIG. 1 and FIG. 2 will be described in detail with reference to FIG. 3 to FIG. 16.

Figure 3:
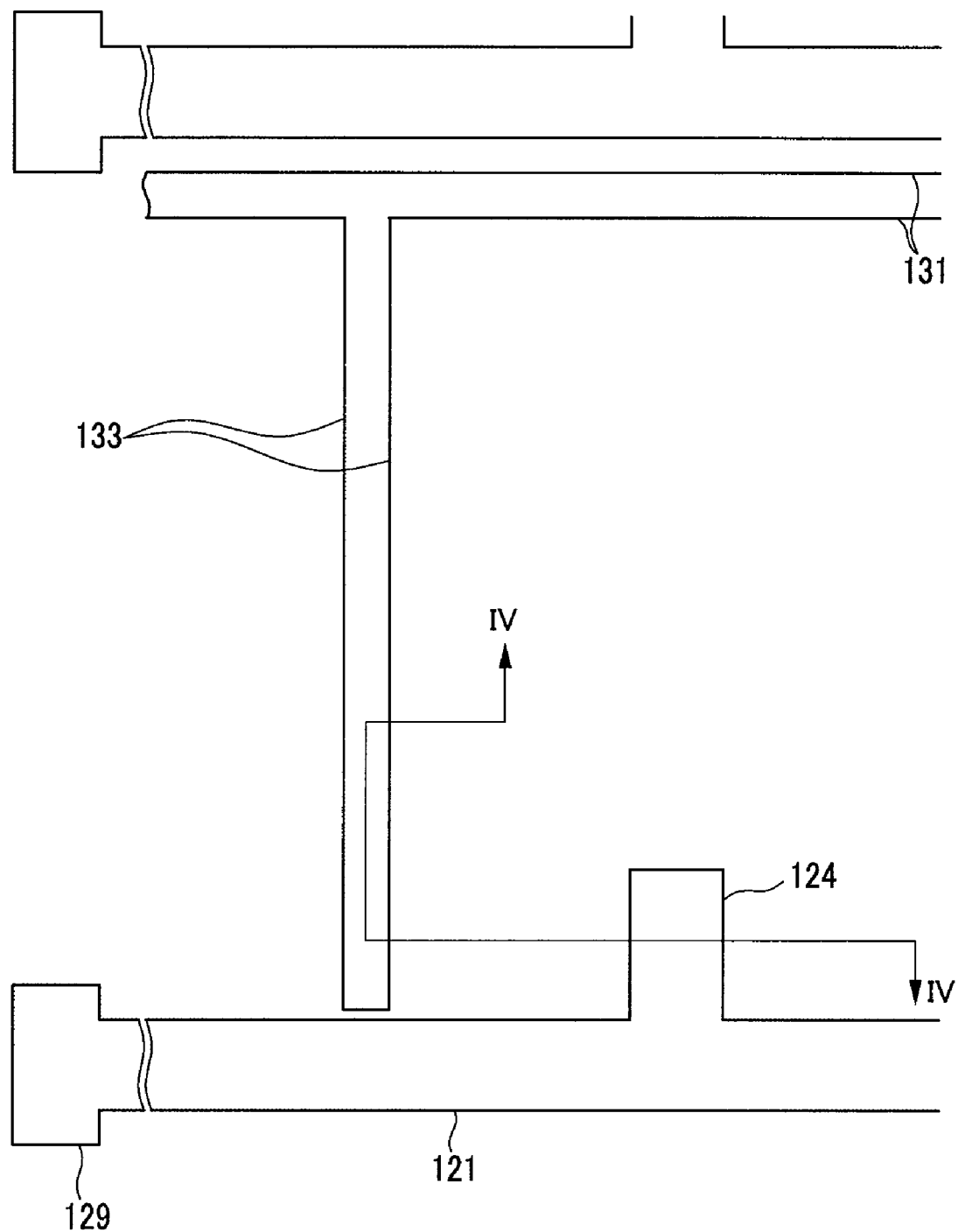
FIG. 3, FIG. 5, FIG. 9, FIG. 11, FIG. 13, and FIG. 15 are layout views sequentially illustrating a method of manufacturing the thin film transistor array panel shown in FIG. 1 and FIG. 2 according to an embodiment of the present invention.
Figure 4:
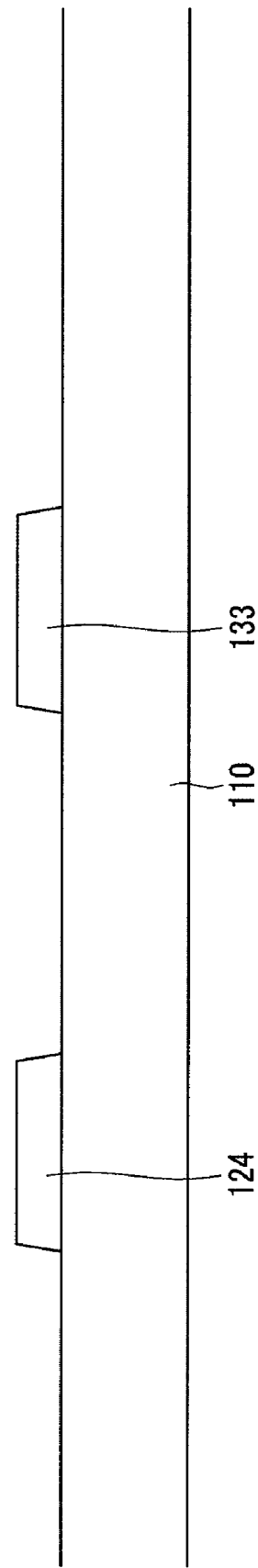
FIG. 4 is a sectional view of the thin film transistor array panel shown in FIG. 3 taken along the line IV-IV.
Figure 5:
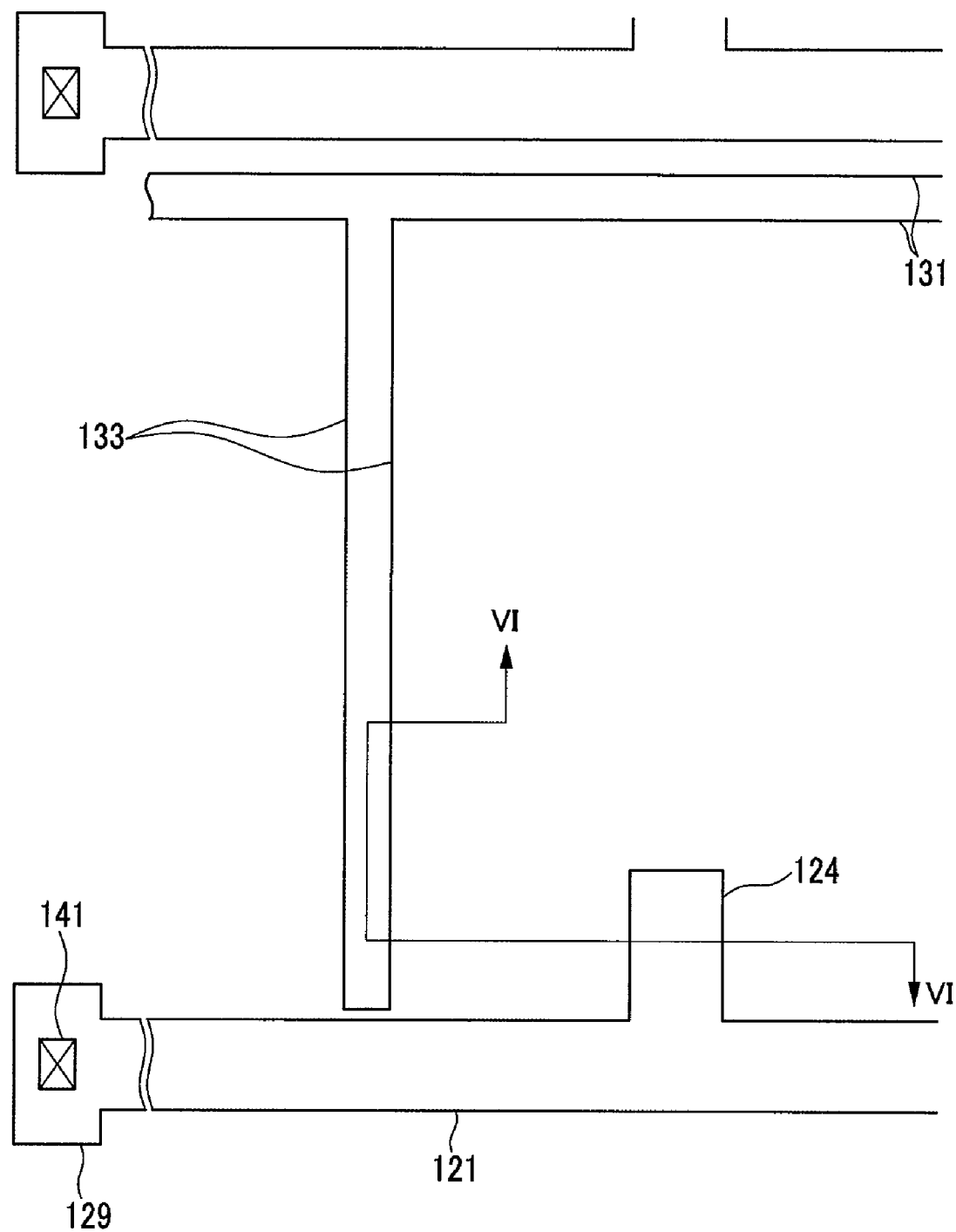
Figure 6:
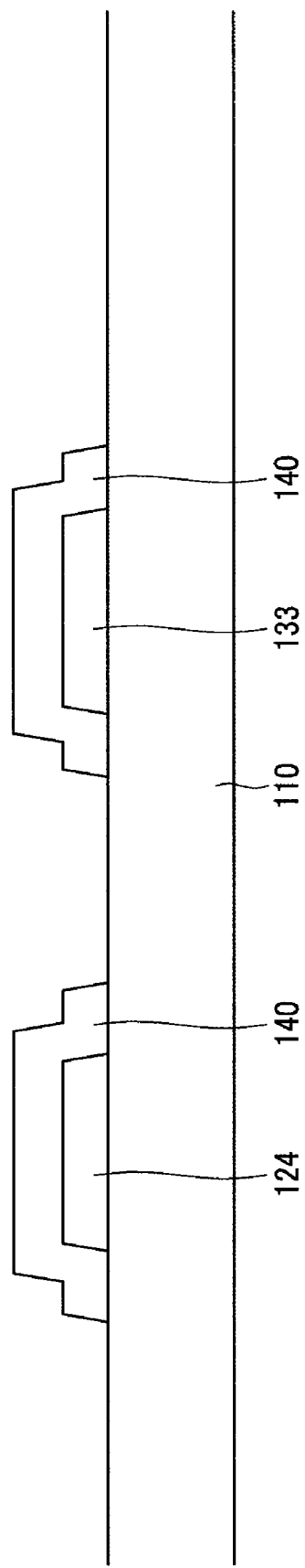
FIG. 6 is a sectional view of the thin film transistor array panel shown in FIG. 5 taken along the line VI-VI.
Figure 7:
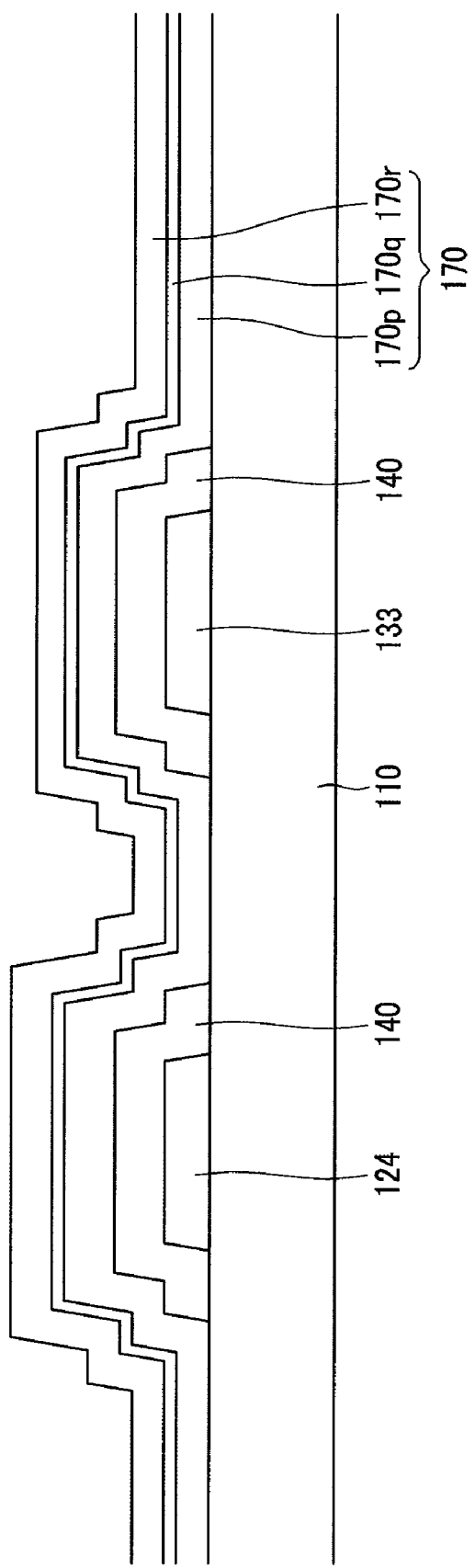
FIG. 7 and FIG. 8 are sectional views sequentially illustrating a method of manufacturing the thin film transistor array panel shown in FIG. 5 and FIG. 6.
Figure 8:
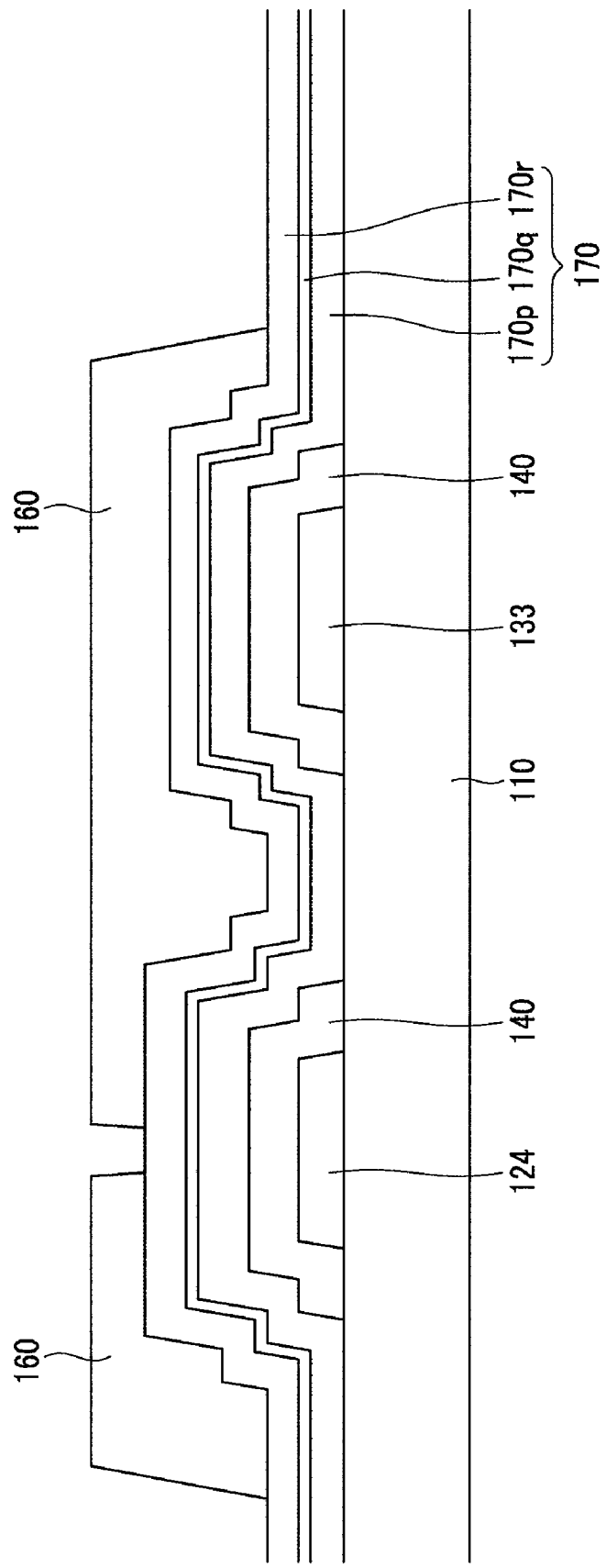
Figure 9:
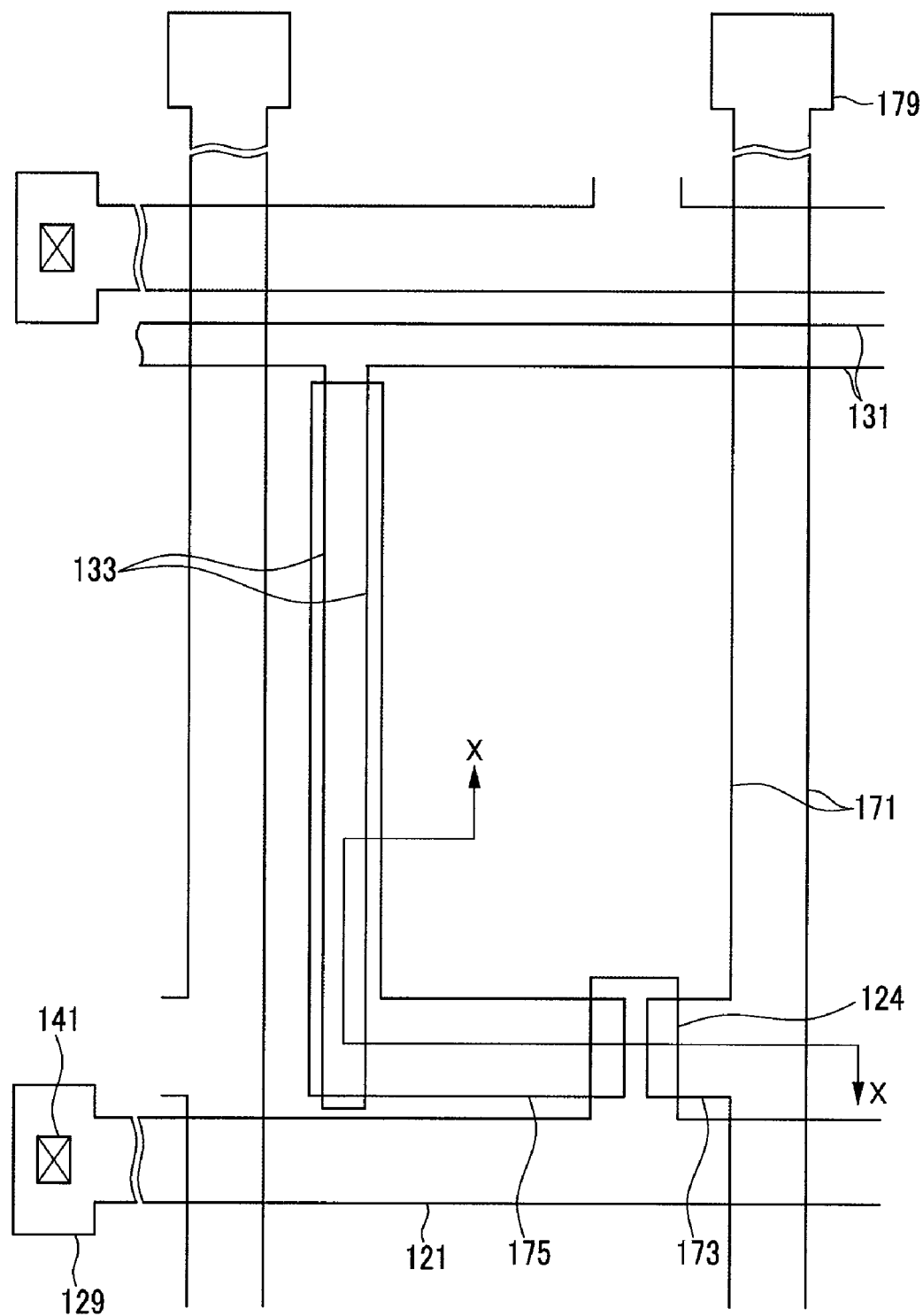
Figure 10:
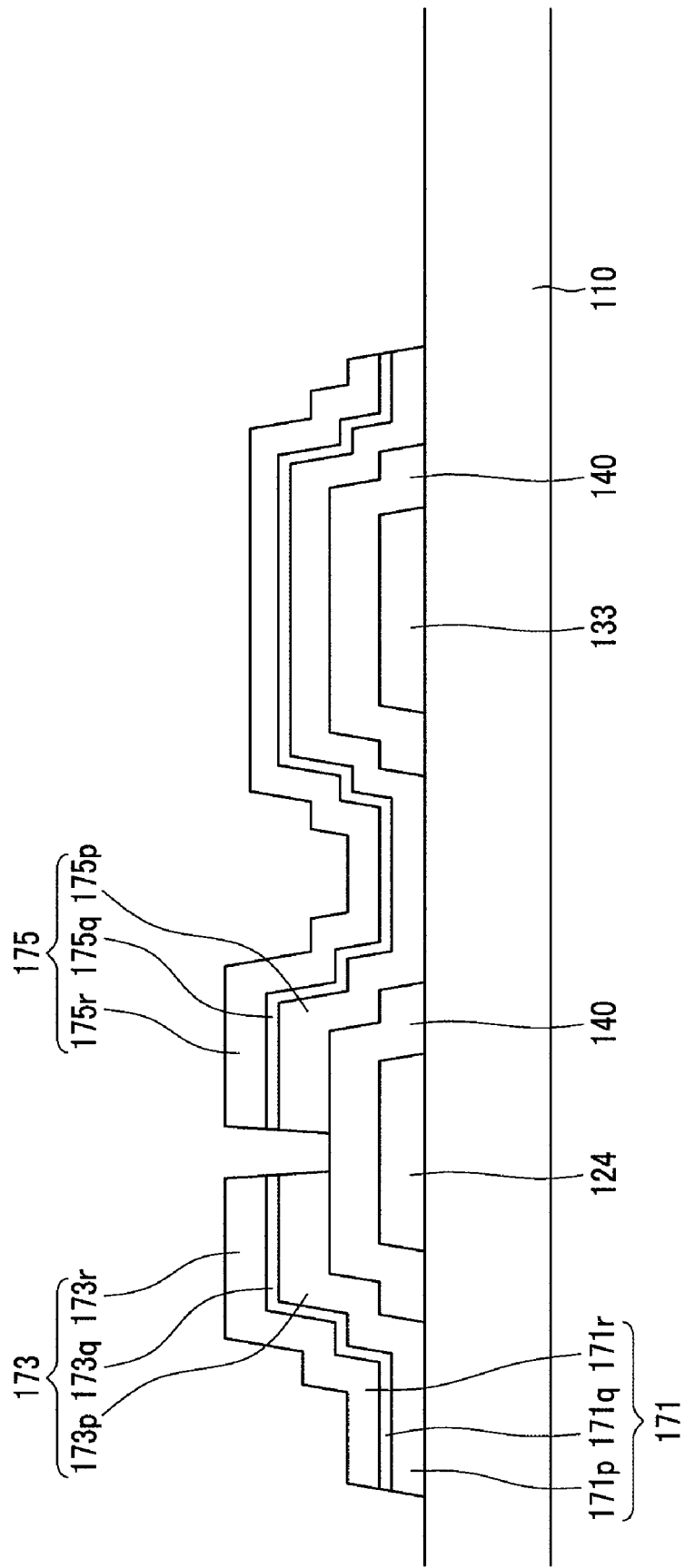
FIG. 10 is a sectional view of the thin film transistor array panel shown in FIG. 9 taken along the line X-X.
Figure 11:
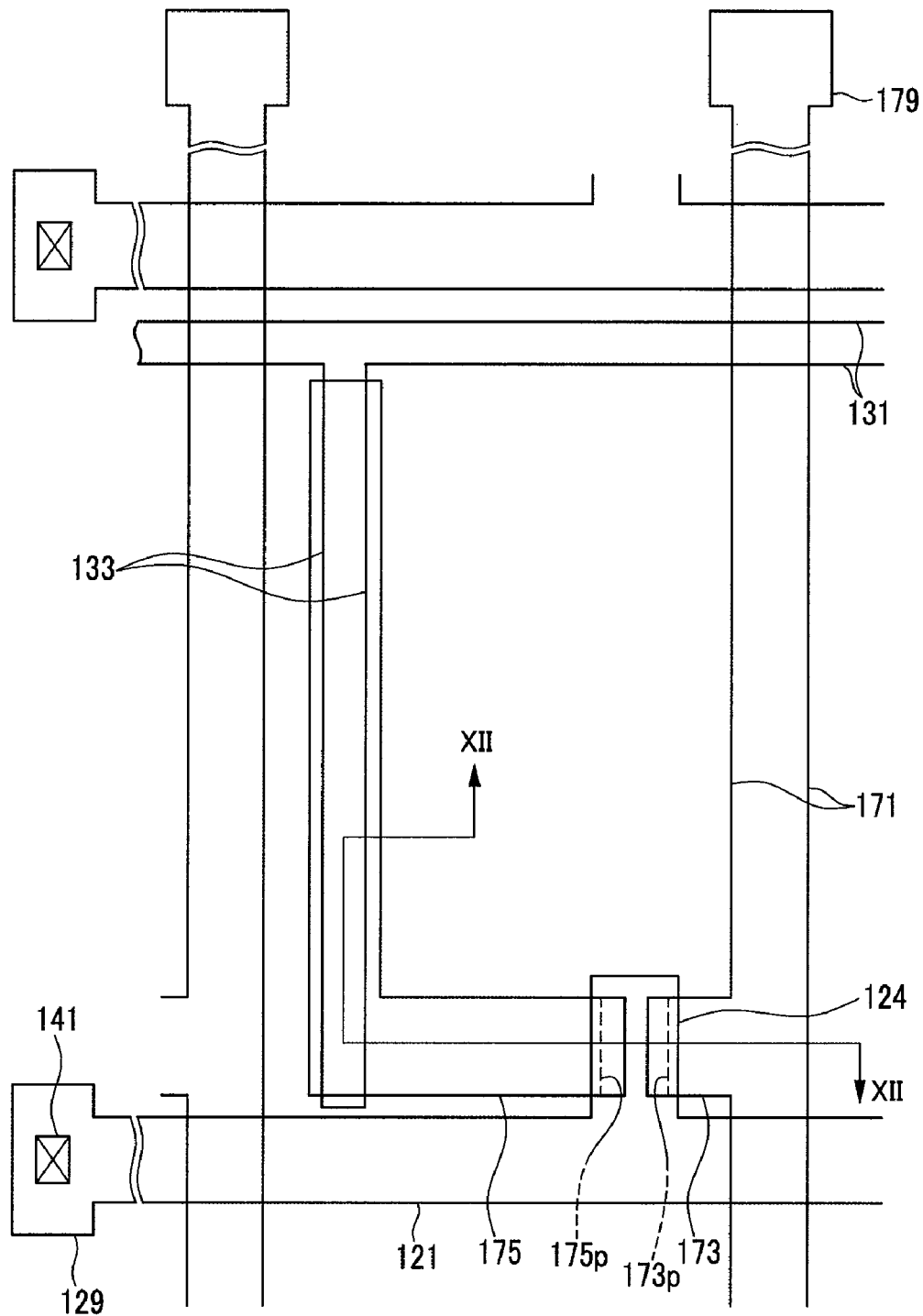
Figure 12:
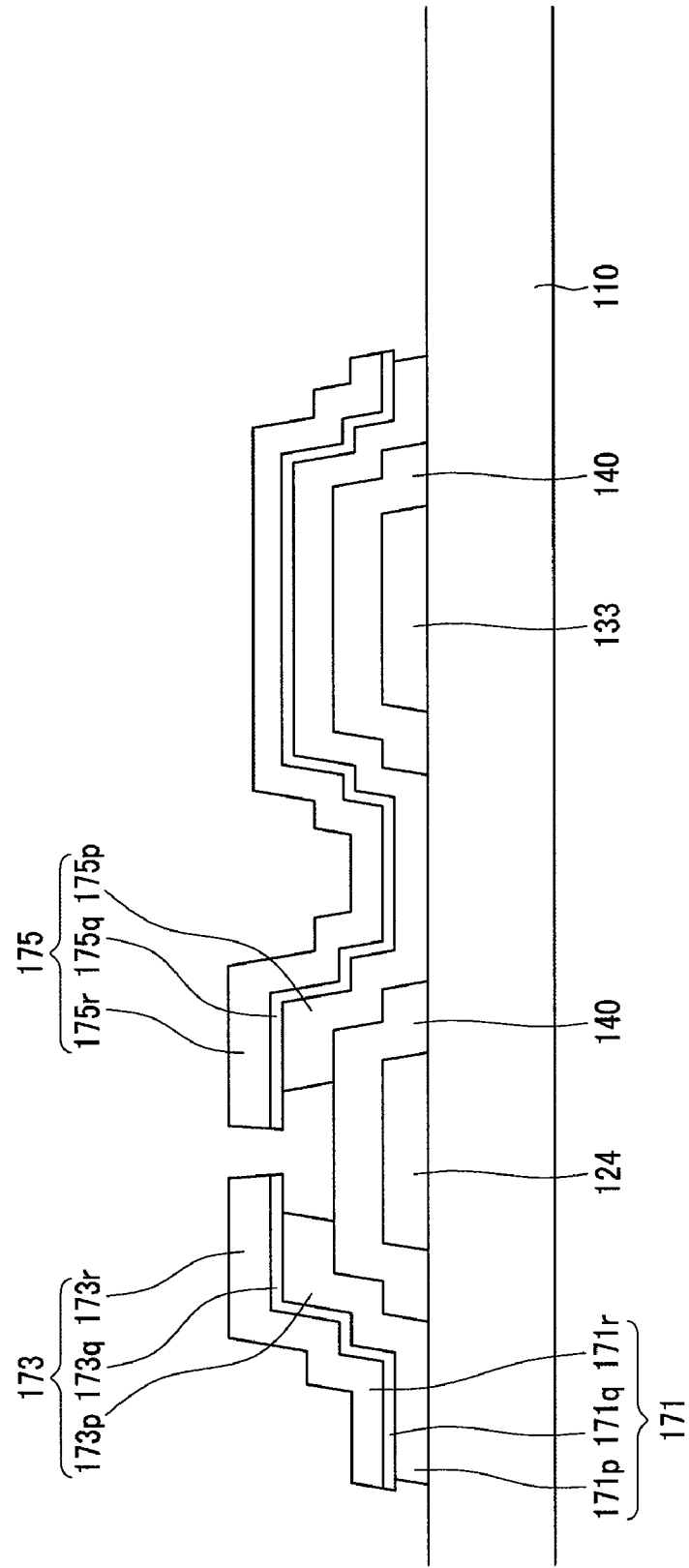
FIG. 12 is a sectional view of the thin film transistor array panel shown in FIG. 11 taken along the line XII-XII.
Figure 13:
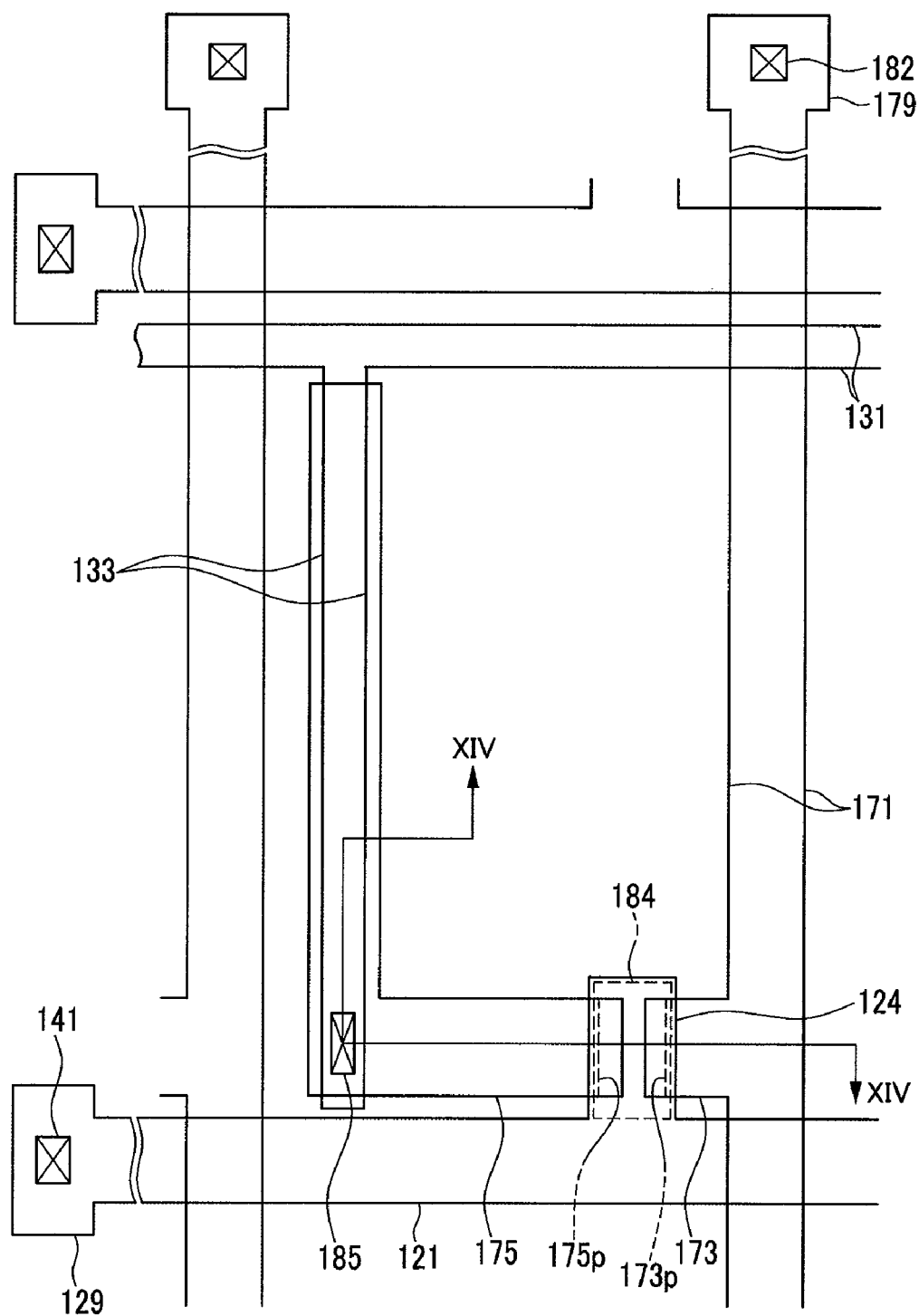
Figure 14:
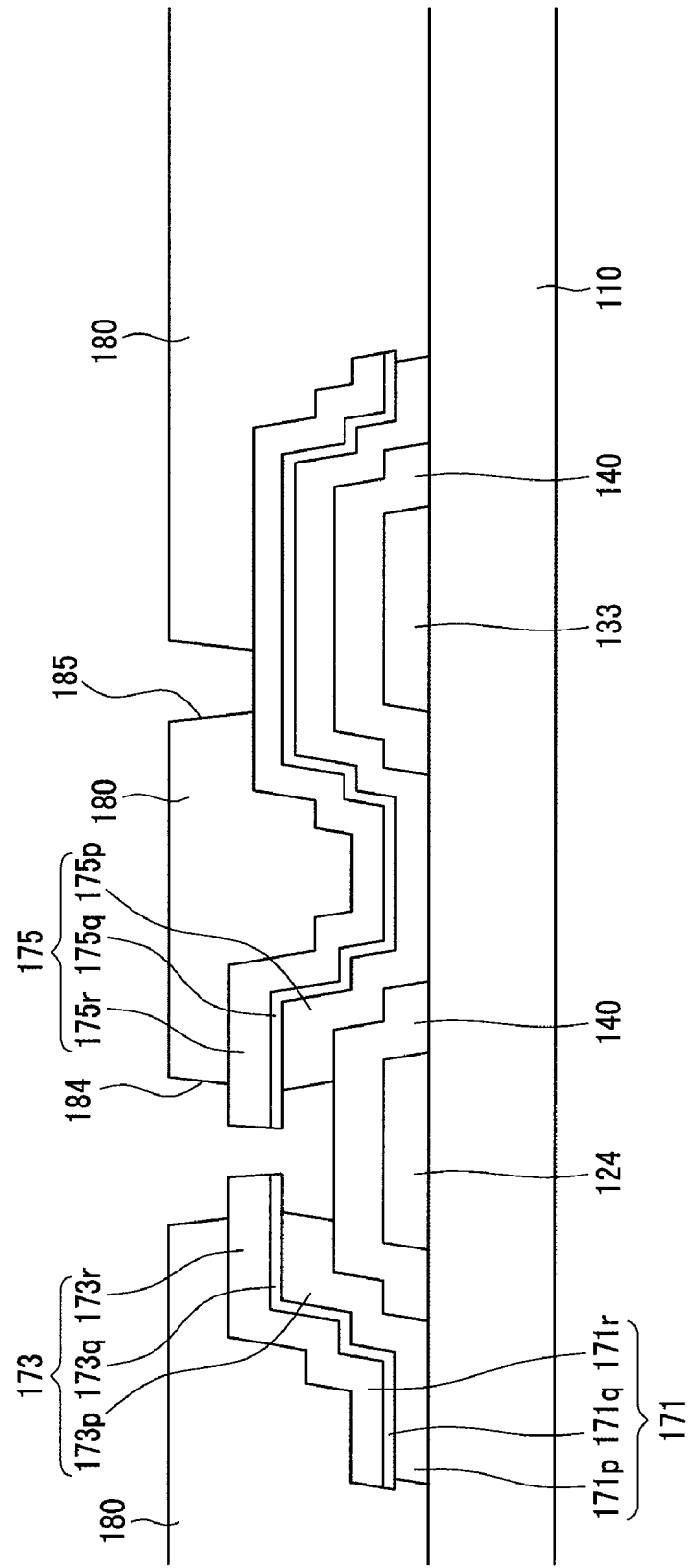
FIG. 14 is a sectional view of the thin film transistor array panel shown in FIG. 13 taken along the line XIV-XIV.
Figure 15:
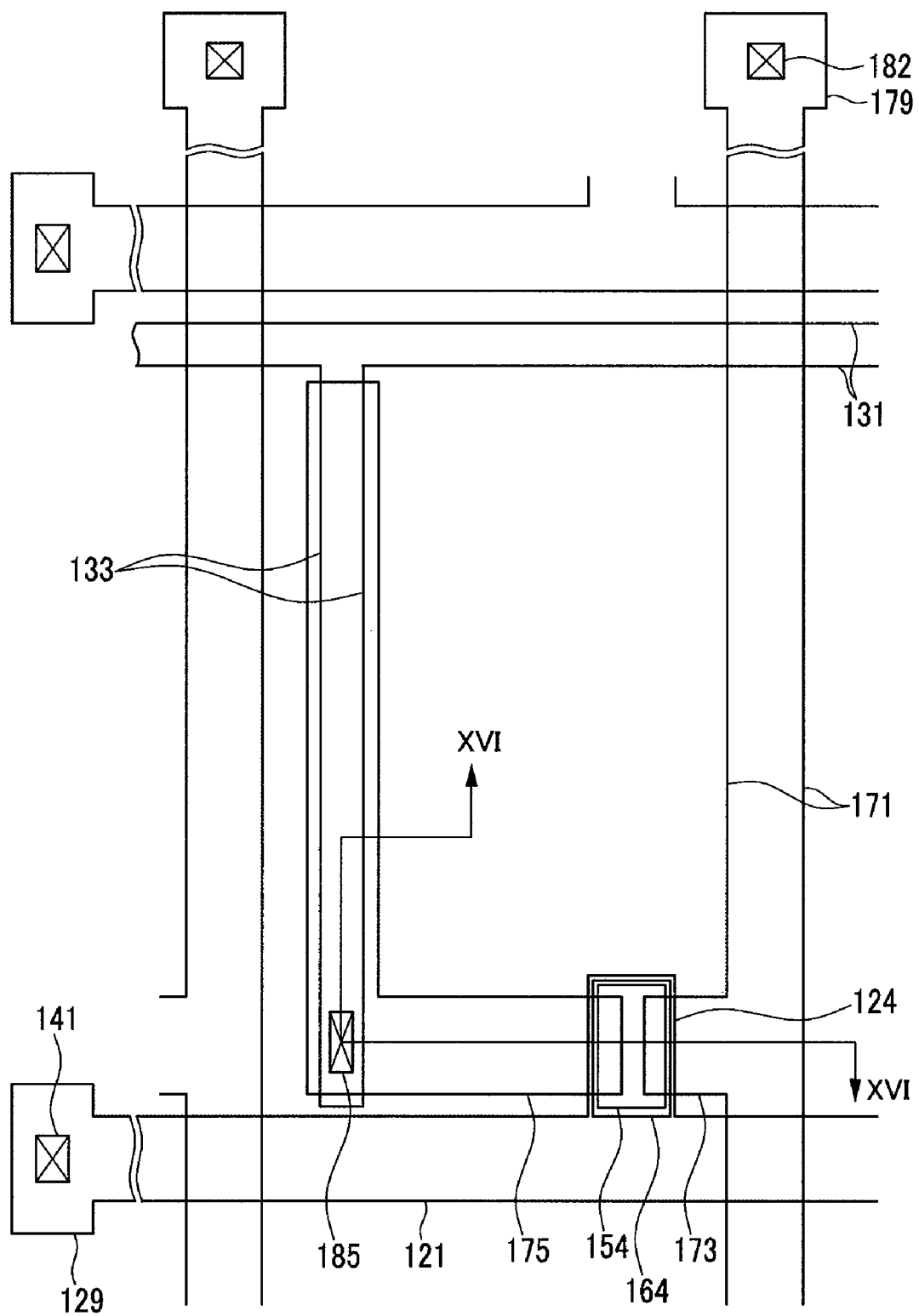
Figure 16:
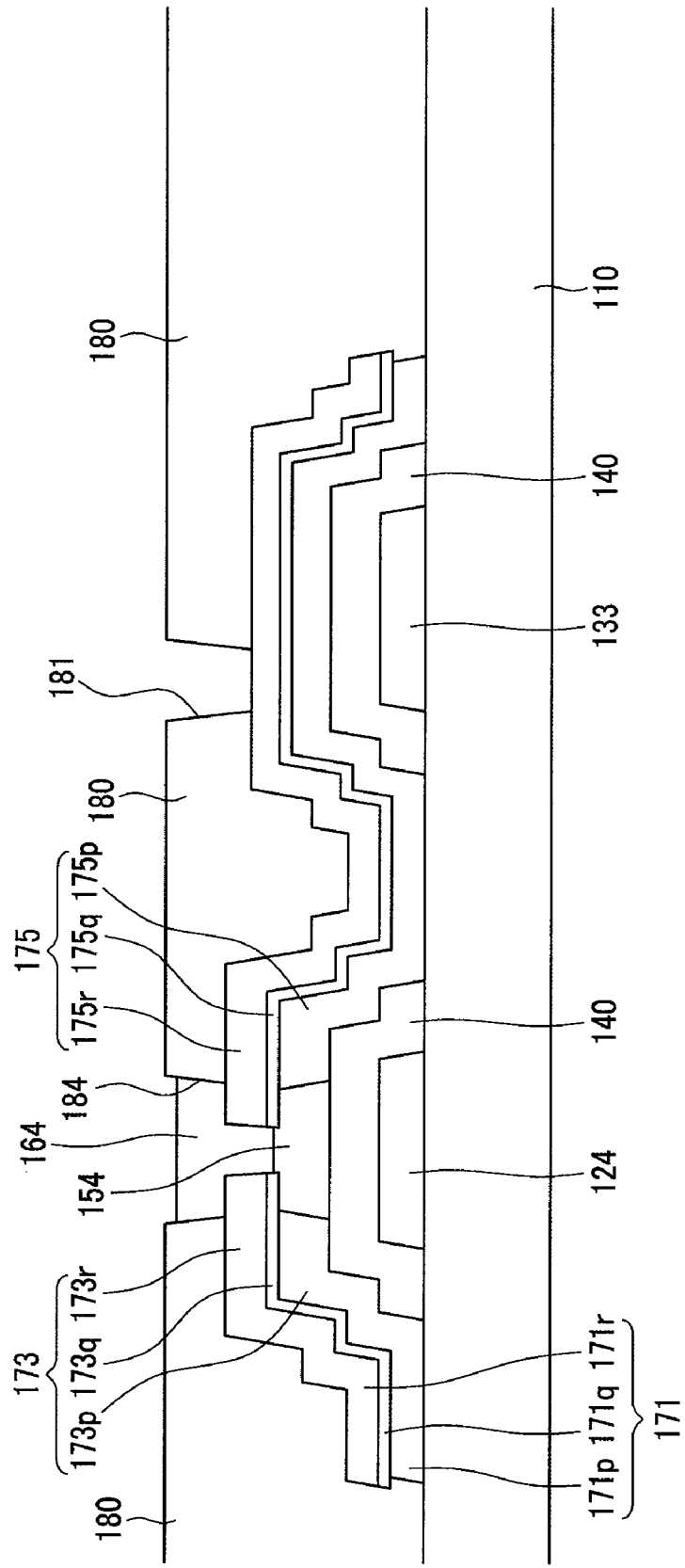
FIG. 16 is a sectional view of the thin film transistor array panel shown in FIG. 15 taken along the line XVI-XVI.

FIG. 3, FIG. 5, FIG. 9, FIG. 11, FIG. 13, and FIG. 15 are layout views sequentially illustrating a method of manufacturing the thin film transistor array panel shown in FIG. 1 and FIG. 2 according to an embodiment of the present invention, FIG. 4 is a sectional view of the thin film transistor array panel shown in FIG. 3 taken along the line IV-IV, FIG. 6 is a sectional view of the thin film transistor array panel shown in FIG. 5 taken along the line VI-VI, FIG. 7 and FIG. 8 are sectional views sequentially illustrating a method of manufacturing the thin film transistor array panel shown in FIG. 5 and FIG. 6, FIG. 10 is a sectional view of the thin film transistor array panel shown in FIG. 9 taken along the line X-X, FIG. 12 is a sectional view of the thin film transistor array panel shown in FIG. 11 taken along the line XII-XII, FIG. 14 is a sectional view of the thin film transistor array panel shown in FIG. 13 taken along the line XIV-XIV, and FIG. 16 is a sectional view of the thin film transistor array panel shown in FIG. 15 taken along the line XVI-XVI.

Firstly, a metal layer is deposited on a substrate 110 and patterned by photolithography to form a plurality of gate lines 121 including a plurality of gate electrodes 124 and end portions 129, and a plurality of storage electrode lines 131 including a plurality of storage electrodes 133, as shown in FIG. 3 and FIG. 4.

Next, an insulating layer 140 is deposited on the substrate 110, the gate lines 121, and the storage electrode lines 131, and a plurality of contact holes 141 exposing the end portions 129 of the gate lines 121 are formed as shown in FIG. 5 and FIG. 6.

A lower conducting layer 170p, a middle conducting layer 170q, and an upper conducting layer 170r are sequentially deposited on the substrate 110 and the insulating layer 140, as shown in FIG. 7. Here, the lower conducting layer 170p, the middle conducting layer 170q, and the upper conducting layer 170r are made of molybdenum, ITO, and chromium, respectively.

Next, an organic layer 160 is coated on the upper conducting layer 170r, and patterned to expose portions of the upper conducting layer, as shown in FIG. 8.

The upper conducting layer 170r, the middle conducting layer 170q, and the lower conducting layer 170p are sequentially etched using the organic layer 160 as a mask to form a plurality of data lines 171 having a plurality of lower data lines 171p including a plurality of lower source electrodes 173p, a plurality of middle data lines 171q including a plurality of middle source electrodes 173q, and a plurality of upper data lines 171r including a plurality of upper source electrodes 173r, and a plurality of drain electrodes 175 having a plurality of lower drain electrodes 175p, a plurality of middle drain electrodes 175q, and a plurality of upper drain electrodes 175r, as shown in FIG. 9 and FIG. 10.

Here, the lower conducting layer 170p, the middle conducting layer 170q, and the upper conducting layer 170r made of molybdenum, ITO, and chromium respectively have different etching ratios, so they are wet-etched using different etchants such that the upper conducting layer 170r is wet-etched using an etchant for chromium, the middle conducting layer 170q is wet-etched using an etchant for ITO, and the lower conducting layer 170p is wet-etched using an etchant for molybdenum.

Next, the lower data lines 171p and the lower drain electrodes 175p are over-etched using the etchant for molybdenum as shown in FIG. 11 and FIG. 12. Here, the over-etching may be performed by continuation of the etching in the etching of the lower conducting layer 170p or by additional etching after the etching of the lower conducting layer 170p. As shown in FIG. 12, the lower data lines 171p have a narrower width than that of the middle data lines 171q and the upper data lines 171r and the lower drain electrodes 175p have a narrower width than that of the middle drain electrodes 175q and the upper drain electrodes 175r by the over-etching of the lower data lines 171p and the lower drain electrodes 175p.

Next, a photosensitive film is coated on the upper data lines 171r and the upper drain electrodes 175r and patterned to form a bank 180 having a plurality of openings 184 exposing portions of the upper source electrodes 173r and the upper drain electrodes 175r and a plurality of contact holes 182 exposing portions of the upper drain electrode 175r, as shown in FIG. 13 and FIG. 14. Here, a surface treatment is performed on the bank 180 using a gas including fluorine to cause the surface of the bank 180 to have a hydrophobic property.

Next, an organic semiconductor solution is dripped in the openings 184 to form a plurality of organic semiconductors 154 disposed between the lower source electrodes 173p and the lower drain electrodes 175p, as shown in FIG. 15 and FIG. 16. The organic semiconductor solution may have a hydrophilic property, so that the organic semiconductor solution has a different surface characteristic to the surface of the bank 180 and thereby the organic semiconductor solution may be kept in the openings 184.

Then, an insulating solution is dripped on the organic semiconductors 154 to form a plurality of passivation layers 164 covering the organic semiconductors 154.

Next, a transparent conductor or a reflective conductor is deposited on the bank 180 and patterned by photolithography to form a plurality of pixel electrodes 191 and a plurality of contact assistants 81 and 82, as shown in FIG. 1 and FIG. 2.

As described above, the thin film transistor array panel according to the present embodiment includes the organic semiconductors 154 contacting the source electrodes 173 and the drain electrodes 175 in the upper portion, and this structure is referred to as a "top contact structure." The channel of the organic thin film transistor may be uniformly adjusted and the thickness of the organic semiconductor may be easily adjusted with the top contact structure. In addition, the organic semiconductor may be prevented from being damaged due to a chemical solution or plasma generated in the etching process of the source electrode 173 and the drain electrode 175 by formation of the organic semiconductor 154 after the formation of the source electrode 173 and the drain electrode 175 in the manufacturing method of the thin film transistor array panel according to the present embodiment.

Exemplary Embodiment 2

Another embodiment of the present invention will be described with reference to FIG. 1 and FIG. 17.

Figure 17:
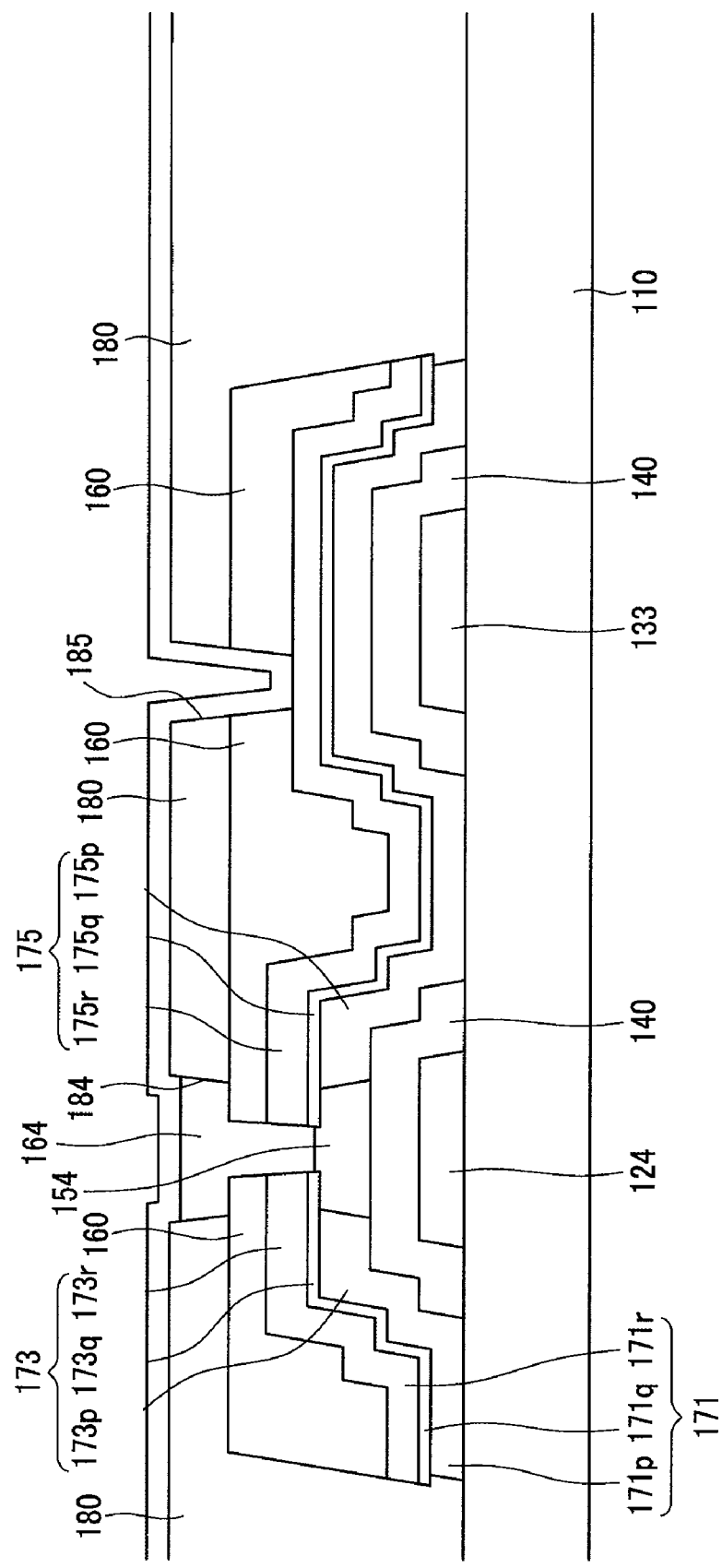
FIG. 17 is a sectional view of the thin film transistor array panel according to another embodiment of the present invention taken along the line II-II of FIG. 1.

FIG. 17 is a sectional view of the thin film transistor array panel according to another embodiment of the present invention taken along the line II-II of FIG. 1.

As shown in FIG. 1 and FIG. 17, a layered structure of the thin film transistor array panel according to the present embodiment is substantially the same as that shown in FIG. 1 and FIG. 2. The same reference numerals of the previous embodiment may be used for the same constituent elements of this embodiment, and additional description thereof may be omitted.

Referring to FIG. 1 and FIG. 17, unlike the thin film transistor array panel shown in FIG. 1 and FIG. 2, the thin film transistor array panel according to the present embodiment includes a plurality of organic layers 160 disposed under the bank 180.

The organic layers 160 are also represented in FIG. 8 of the previous exemplary embodiment, but the organic layers 160 are removed after the photolithography process of the data lines 171 and the drain electrodes 175 in the previous exemplary embodiment. The organic layers 160 are not removed in the present embodiment.

As shown in FIG. 17, the organic layers 160 are formed on the data lines 171 and the drain electrodes 175, and the organic layers 160 function as a mask while forming the data lines 171 and the drain electrodes 175. Accordingly, the organic layers 160 have substantially the same planar shape as that of the data lines 171 and the drain electrodes 175.

The organic layers 160 are subjected to the surface treatment using a gas including fluorine along with the bank 180 during the surface treatment of the bank 180 described above, and so the organic semiconductor solution has a different surface characteristic to the organic layers 160 and thereby the organic semiconductor solution may be kept in the openings 184 and may not remain on the organic layers 160 and the source electrodes 173 and the drain electrodes 175 disposed thereunder. Accordingly, side effects caused by remaining organic semiconductor solution on the source electrodes 173 and the drain electrodes 175 may be prevented.

Exemplary Embodiment 3

Now, a thin film transistor array panel according to another embodiment of the present invention will be described with reference to FIG. 18 and FIG. 19. The same reference numerals of the previous embodiment may be used for the same constituent elements of this embodiment, and additional description thereof may be omitted.

Figure 18:
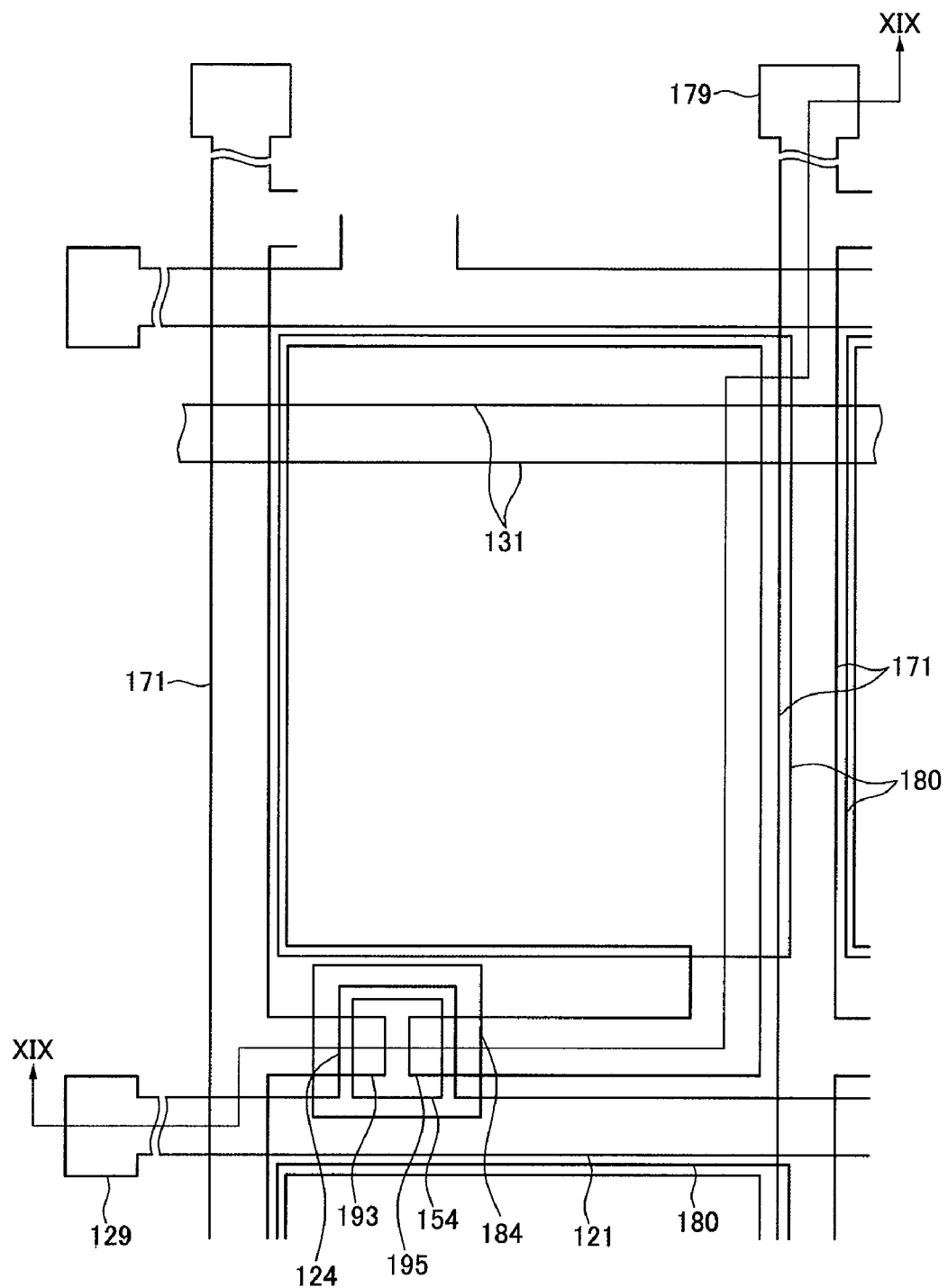
FIG. 18 is a layout view of a thin film transistor array panel according to another embodiment of the present invention.
Figure 19:
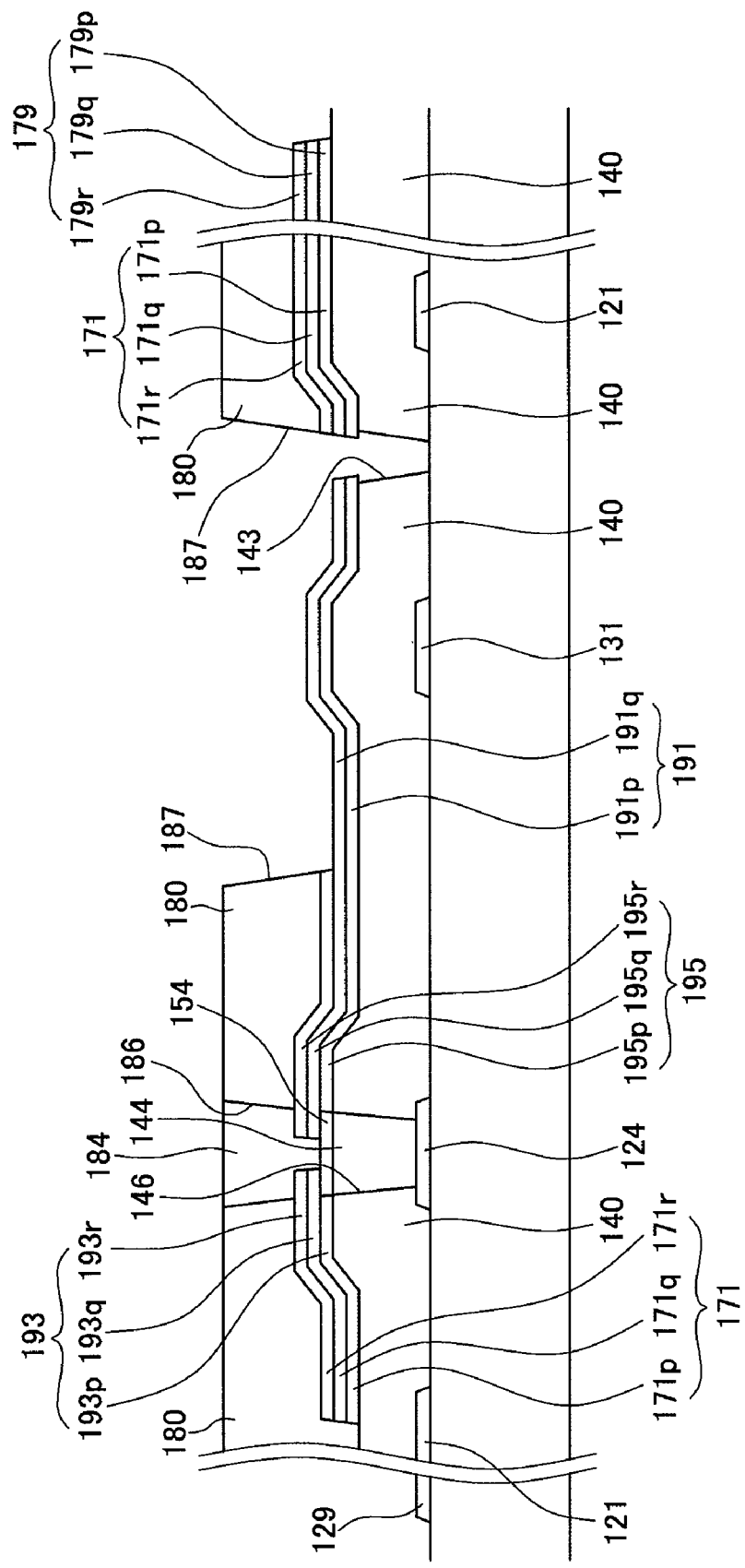
FIG. 19 is a sectional view of the thin film transistor array panel shown in FIG. 18 taken along the line XIX-XIX.

FIG. 18 is a layout view of a thin film transistor array panel according to another embodiment of the present invention, and FIG. 19 is a sectional view of the thin film transistor array panel shown in FIG. 18 taken along the line XIX-XIX.

A plurality of gate lines 121 including gate electrodes 124 and end portions 129, and a plurality of storage electrode lines 131, are formed on a substrate 110.

An interlayer insulating layer 140 is formed on the gate lines 121 and the storage electrode lines 131. The interlayer insulating layer 140 may be made of an organic material or an inorganic material having a low dielectric constant of about 2.5 to 4.0. The organic material includes a soluble high polymer compound such as a polyacryl based compound, a polystyrene based compound, and benzocyclobutane (BCB), and the inorganic material includes silicon nitride and silicon oxide.

The interlayer insulating layer 140 has a low dielectric constant, so that parasitic capacitances between the gate lines 121 and the upper conductor layers may be reduced.

The interlayer insulating layer 140 is removed on portions adjacent to the end portions 129 of the gate lines 121.

The interlayer insulating layer 140 has a plurality of openings 146 exposing the gate electrodes 124, and a plurality of portions 143 exposing the substrate 110.

A plurality of gate insulators 144 are formed in the openings 146 of the interlayer insulating layer 140. The gate insulators 144 cover the gate electrodes 124. The side walls of the openings 146 have the same height as the gate insulators 144, and the openings 146 have a size that is sufficiently large for the gate insulators 144 to have a flat surface.

The gate insulators 144 may be made of an organic material or an inorganic material having a high dielectric constant of about 3.5 to 10. The organic material includes a soluble high polymer compound such as a polyimide based compound, a polyvinyl alcohol based compound, a polyfluorane based compound, and parylene, and the inorganic material includes silicon oxide subjected to a surface treatment with octadecyl trichloro silane (OTS). Particularly, the gate insulators 144 preferably have a higher dielectric constant than the interlayer insulating layers 140.

The gate insulators 144 have a high dielectric constant such that a threshold voltage of an organic thin film transistor may be reduced and the current amount ($I_{on}$) may be increased to raise the efficiency of the organic thin film transistor.

A plurality of data lines 171 including a plurality of source electrodes 193, and a plurality of pixel electrodes 191, are formed on the interlayer insulating layer 140 and the gate insulators 144.

The data lines 171 have a triple-layered structure including lower data lines 171p including lower source electrodes 193p and lower end portions 179p, middle data lines 171q including middle source electrodes 193q and middle end portions 179q, and upper data lines 171r including upper source electrodes 193r and upper end portions 179r.

The lower data lines 171p and the upper data lines 171r may be made of metals having different etching ratios from each other. For example, the lower data lines 171p include molybdenum (Mo), and the upper data lines 171r include chromium (Cr). Here, the middle data lines 171q may be made of a transparent conductive material such as ITO and IZO. Otherwise, the lower data lines 171p may be made of amorphous ITO, the middle data lines 171q may be made of poly ITO, and the upper data lines 171r may be made of a metal such as molybdenum and chromium. However, the data lines 171 may be made of various metals or conductors.

Each pixel electrode 191 includes a drain electrode 195 disposed opposite the source electrode 193, and each drain electrode 195 includes a lower drain electrode 195p, a middle drain electrode 195q, and an upper drain electrode 195r. In a display area, the upper layer of the pixel electrode 191, which is made of the same material as the upper drain electrode 195r, is removed such that the lower pixel electrode 191p and the middle pixel electrode 191q remain.

A plurality of organic semiconductors 154 are formed on the gate insulators 144 between the lower source electrodes 193p and the lower drain electrodes 195p. The organic semiconductors 154 are disposed over the gate electrodes 124, and the organic semiconductors 154 contact the source electrodes 193 and the drain electrodes 195 in the upper portion in a structure referred to as a "top contact structure."

A bank 180, having a plurality of openings 186 exposing portions of the source electrodes 193, portions of the drain electrodes 195, and the organic semiconductors 154 disposed between the lower source electrodes 193p and the lower drain electrodes 195p, and a plurality of openings 187 exposing the pixel electrodes 191, is formed on the data lines 171 and the drain electrodes 195. The openings 184 of the bank 180 have a larger size than the openings 146 of the interlayer insulating layer 140.

A plurality of passivation layers 164 are formed on the openings 184 of the bank 180.

Now, a manufacturing method of the thin film transistor array panel shown in FIG. 18 and FIG. 19 will be described with reference to FIG. 20 to FIG. 31.

Figure 20:
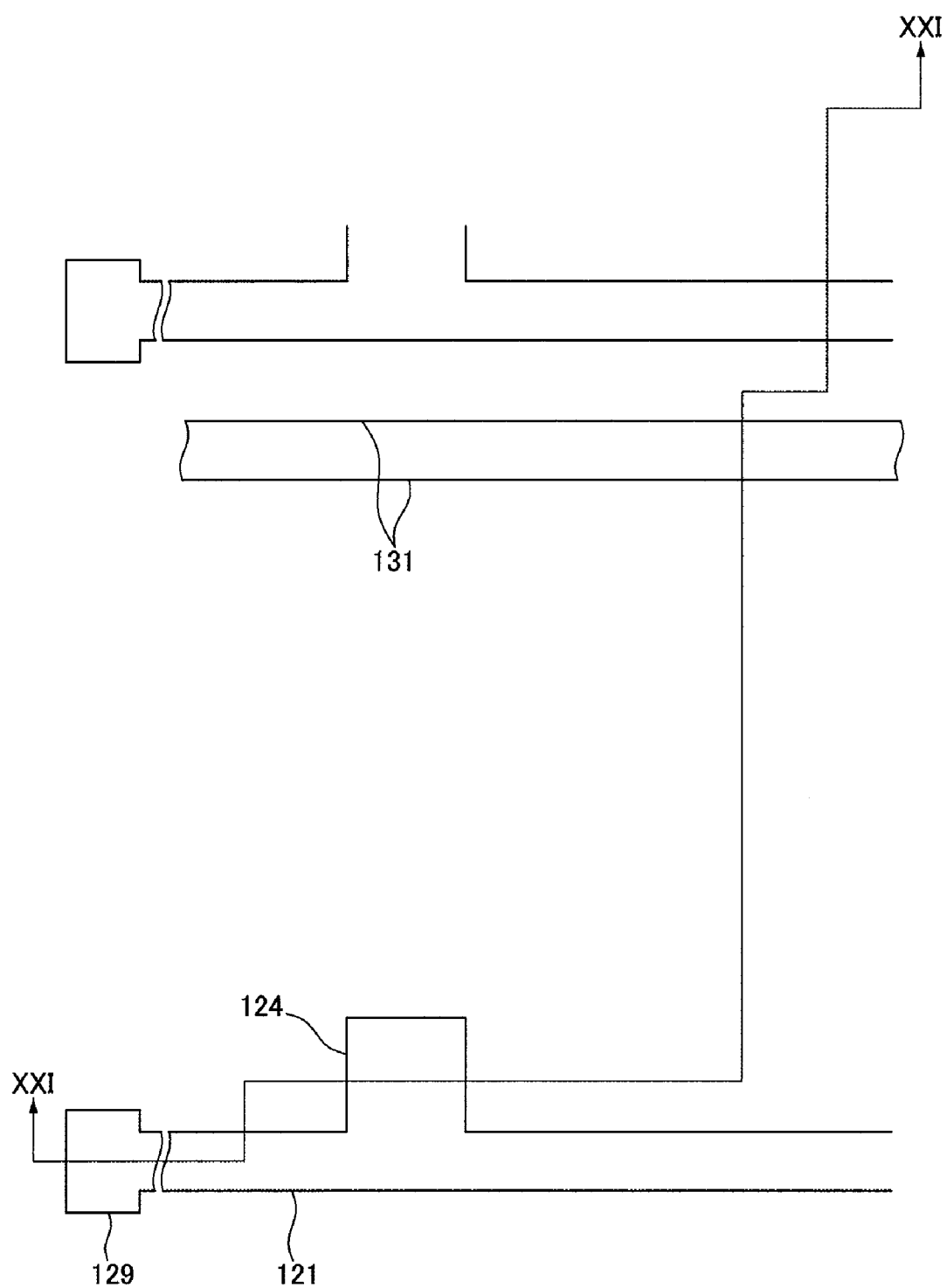
FIG. 20, FIG. 23, FIG. 28, and FIG. 30 are layout views sequentially illustrating a method of manufacturing the thin film transistor array panel shown in FIG. 18 and FIG. 19 according to another embodiment of the present invention.
Figure 21:
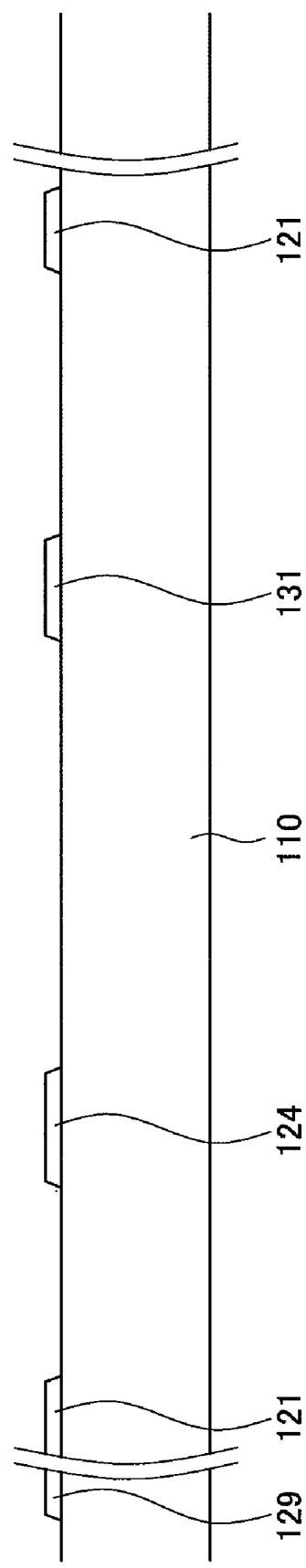
FIG. 21 is a sectional view of the thin film transistor array panel shown in FIG. 20 taken along the line XXI-XXI.
Figure 22:
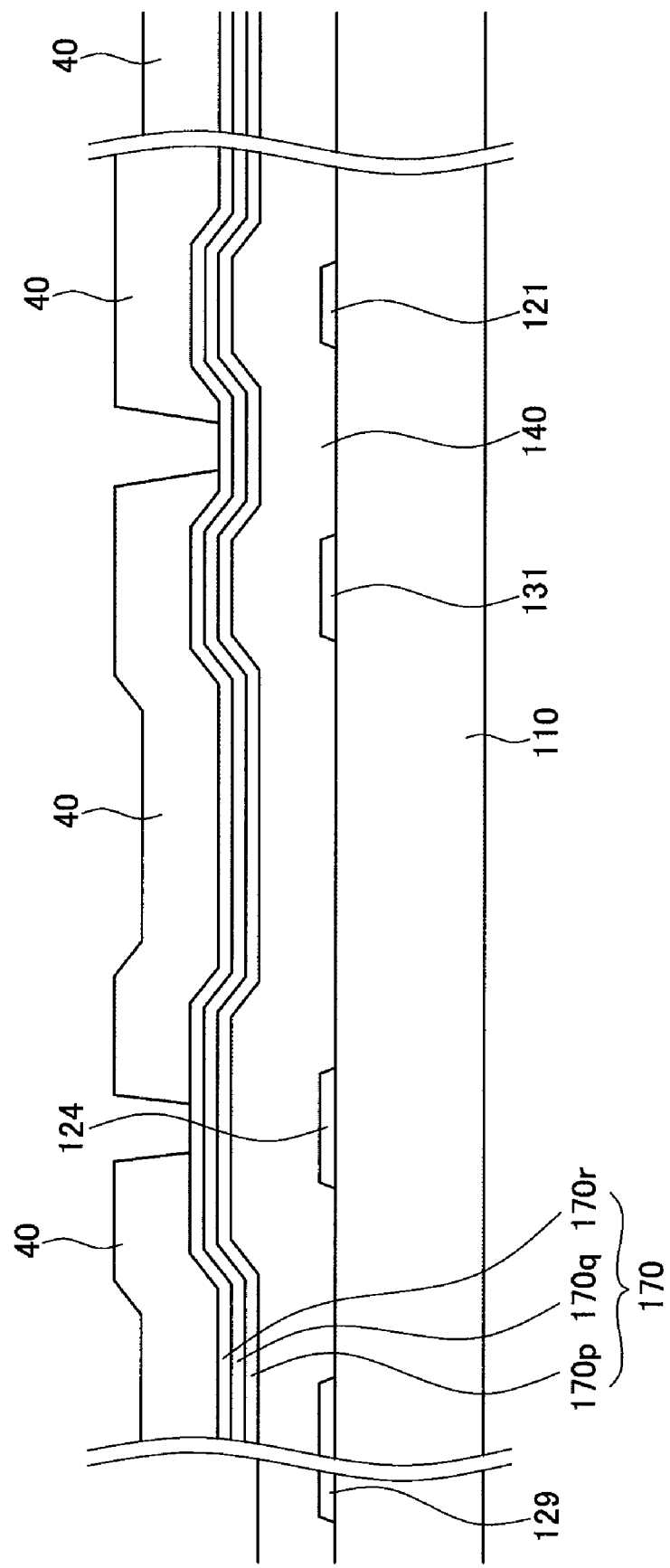
FIG. 22 are sectional views sequentially illustrating a method of manufacturing the thin film transistor array panel shown in FIG. 20 and FIG. 21.
Figure 23:
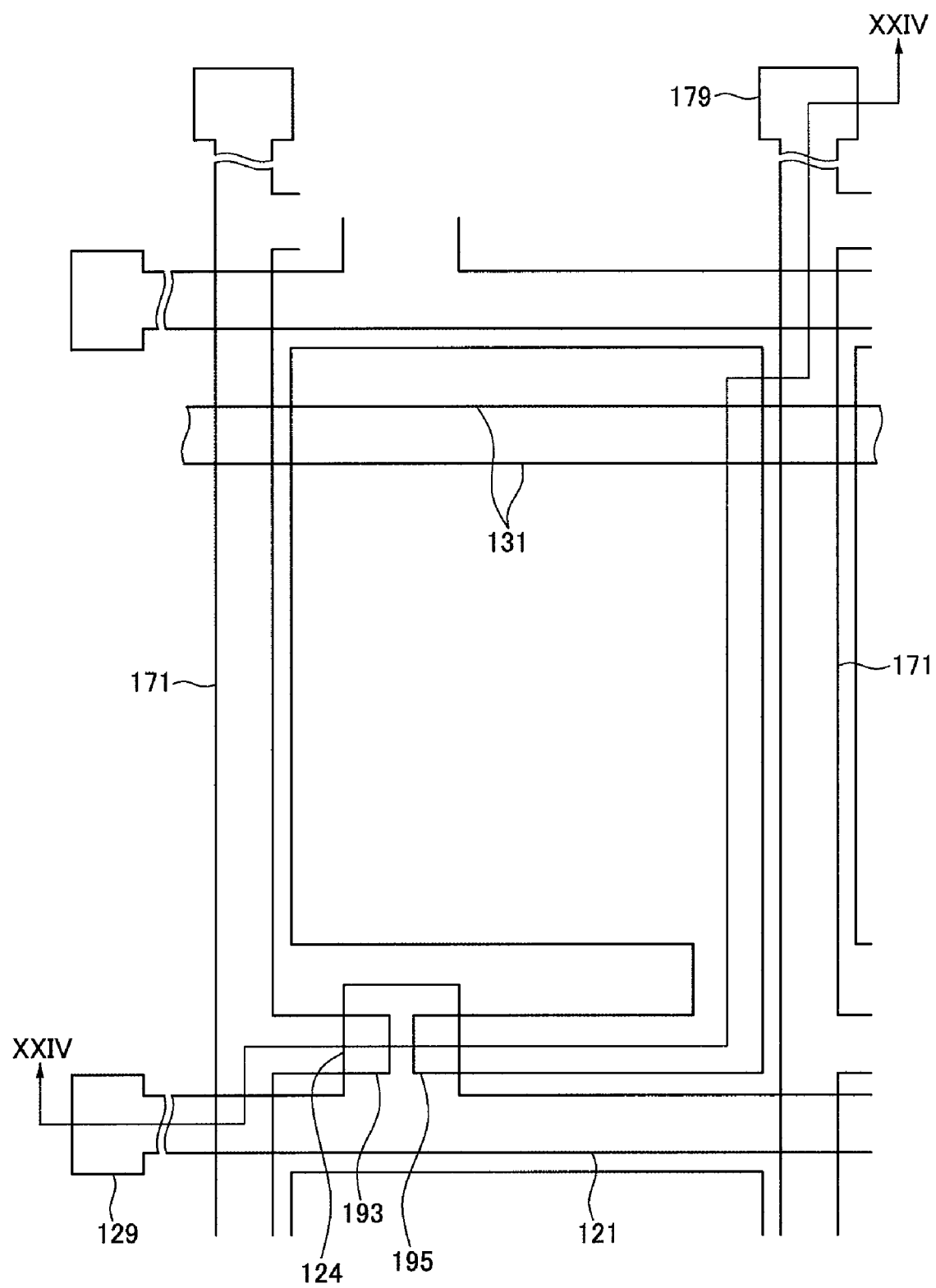
Figure 24:
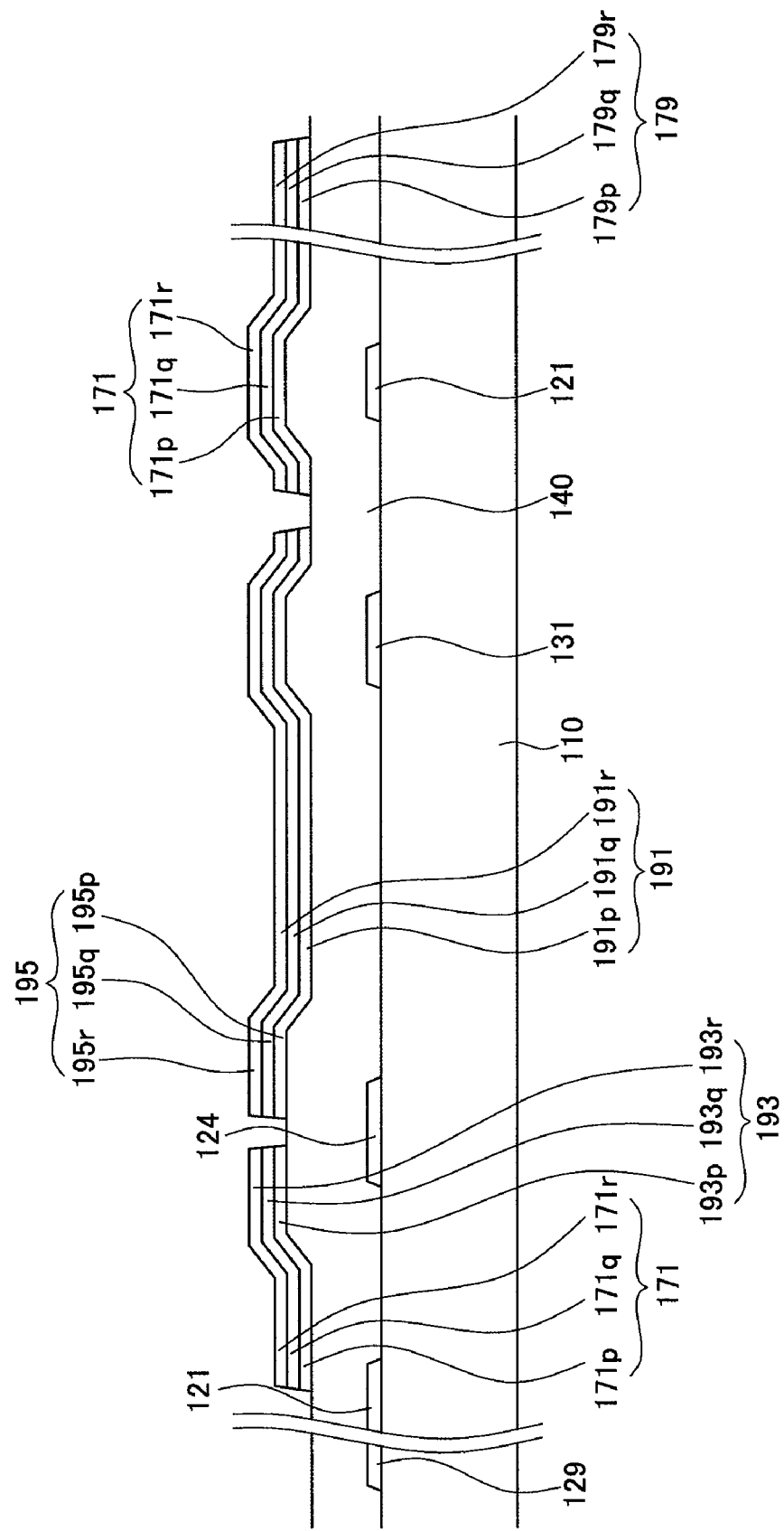
FIG. 24 is a sectional view of the thin film transistor array panel shown in FIG. 23 taken along the line XXIV-XXIV.
Figure 25:
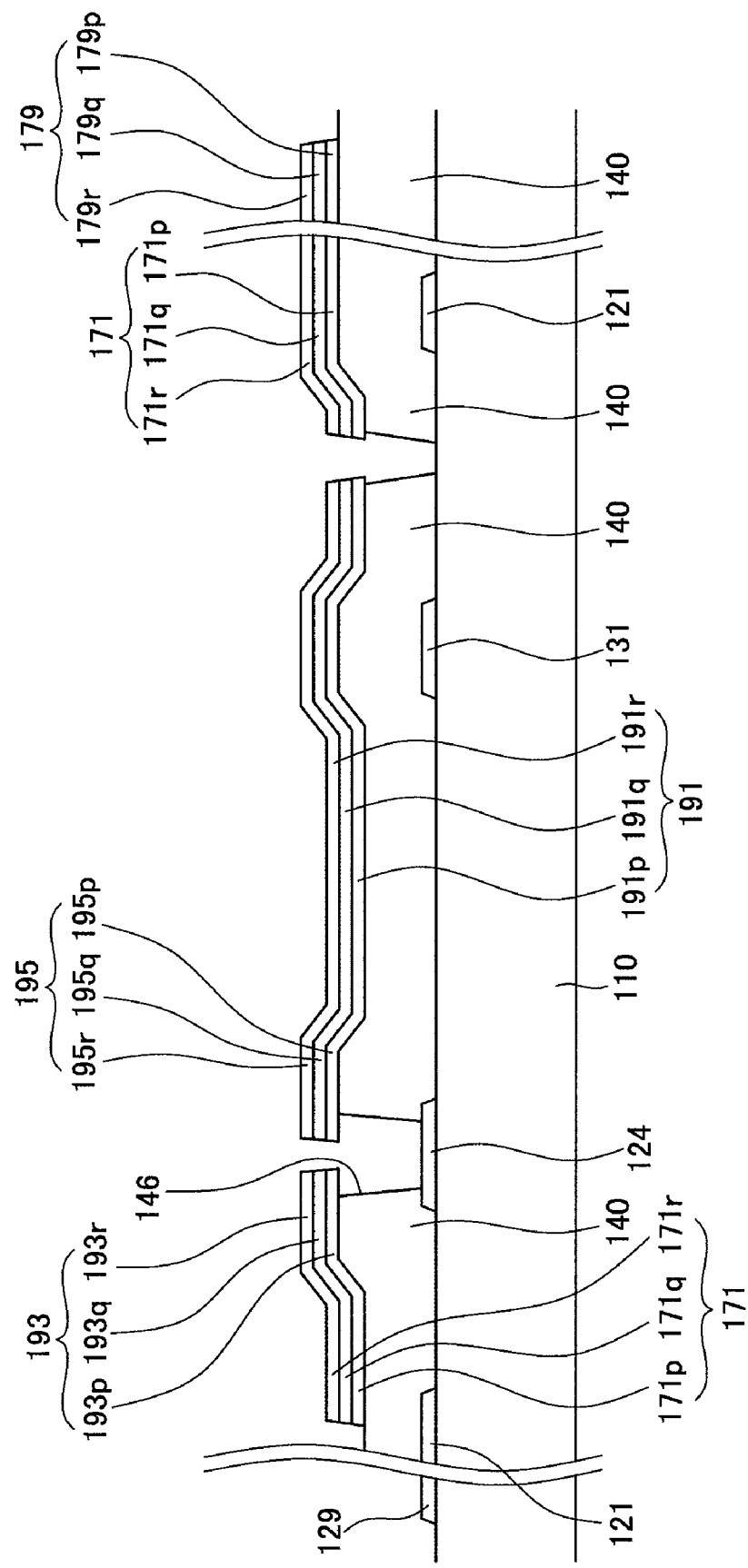
FIG. 25 to FIG. 27 are sectional views sequentially illustrating a method of manufacturing the thin film transistor array panel shown in FIG. 23 and FIG. 24.
Figure 26:
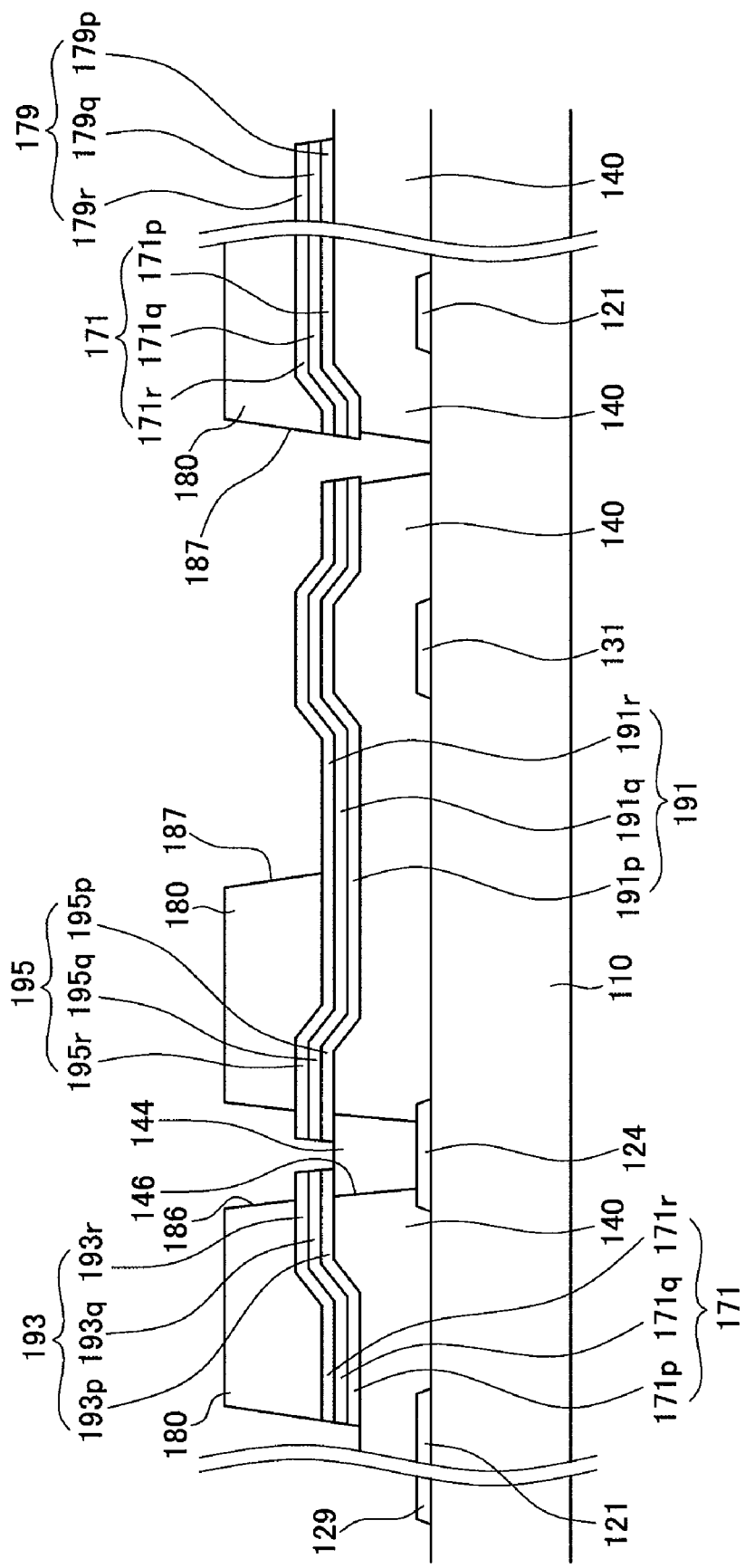
Figure 27:
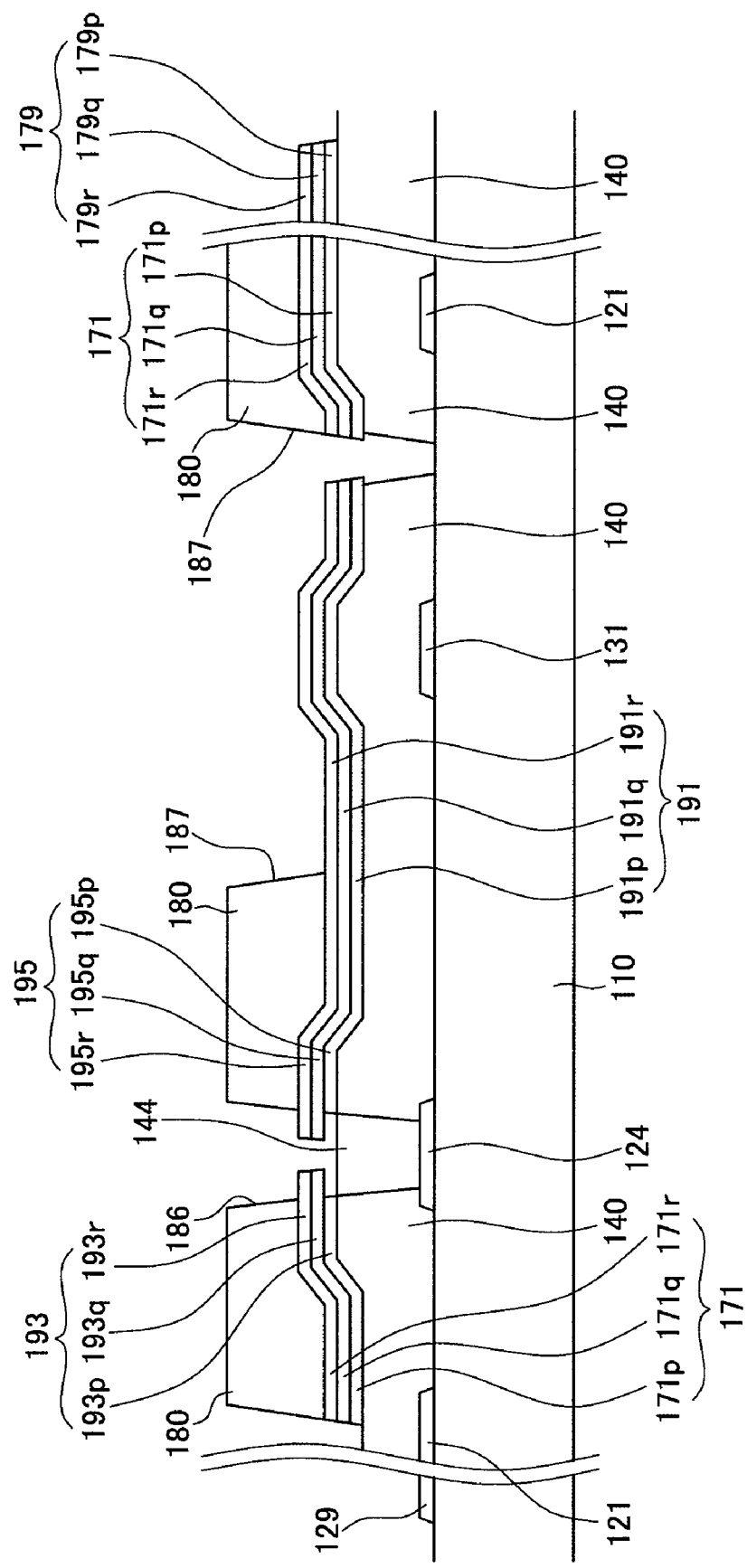
Figure 28:
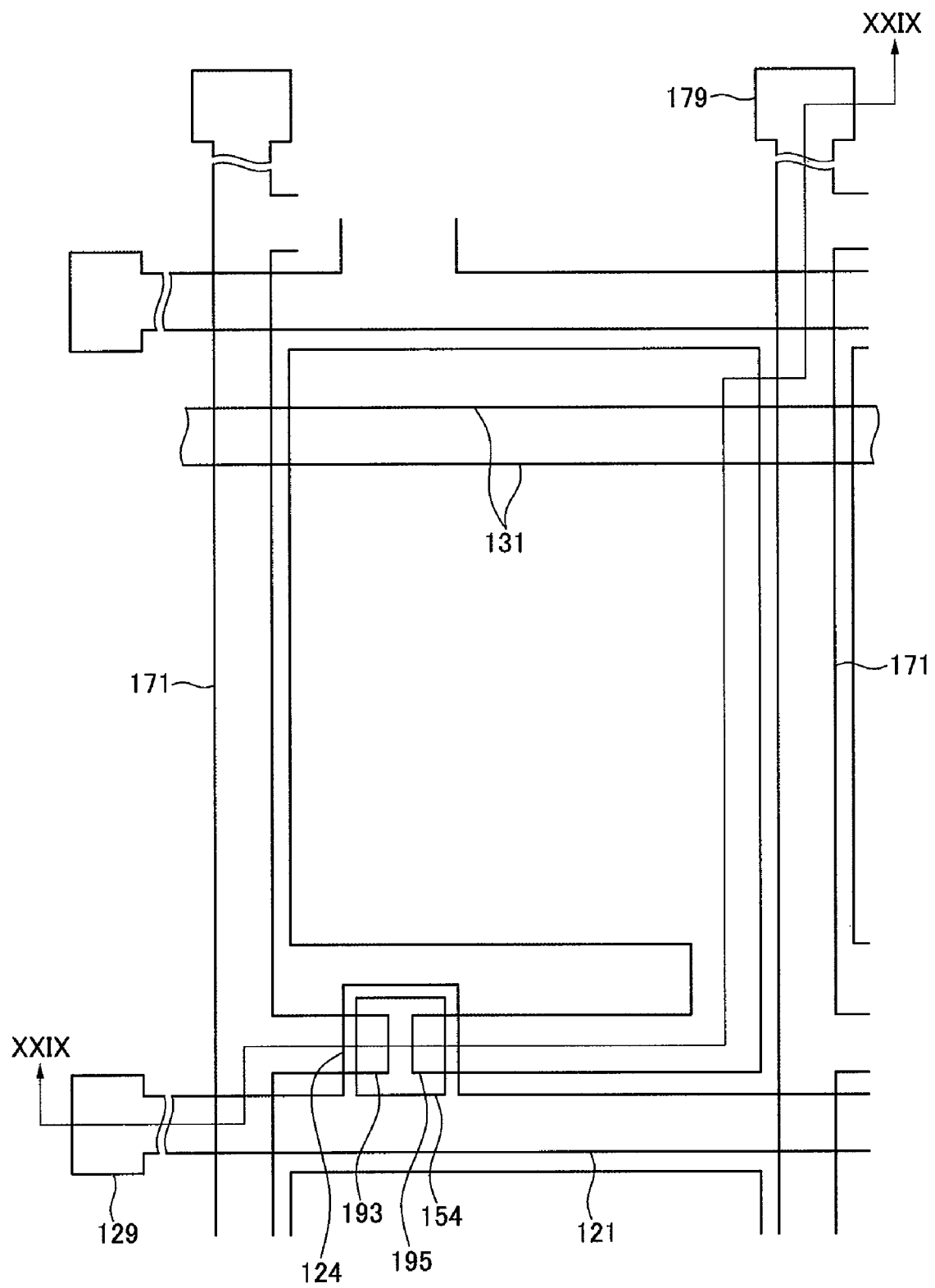
Figure 29:
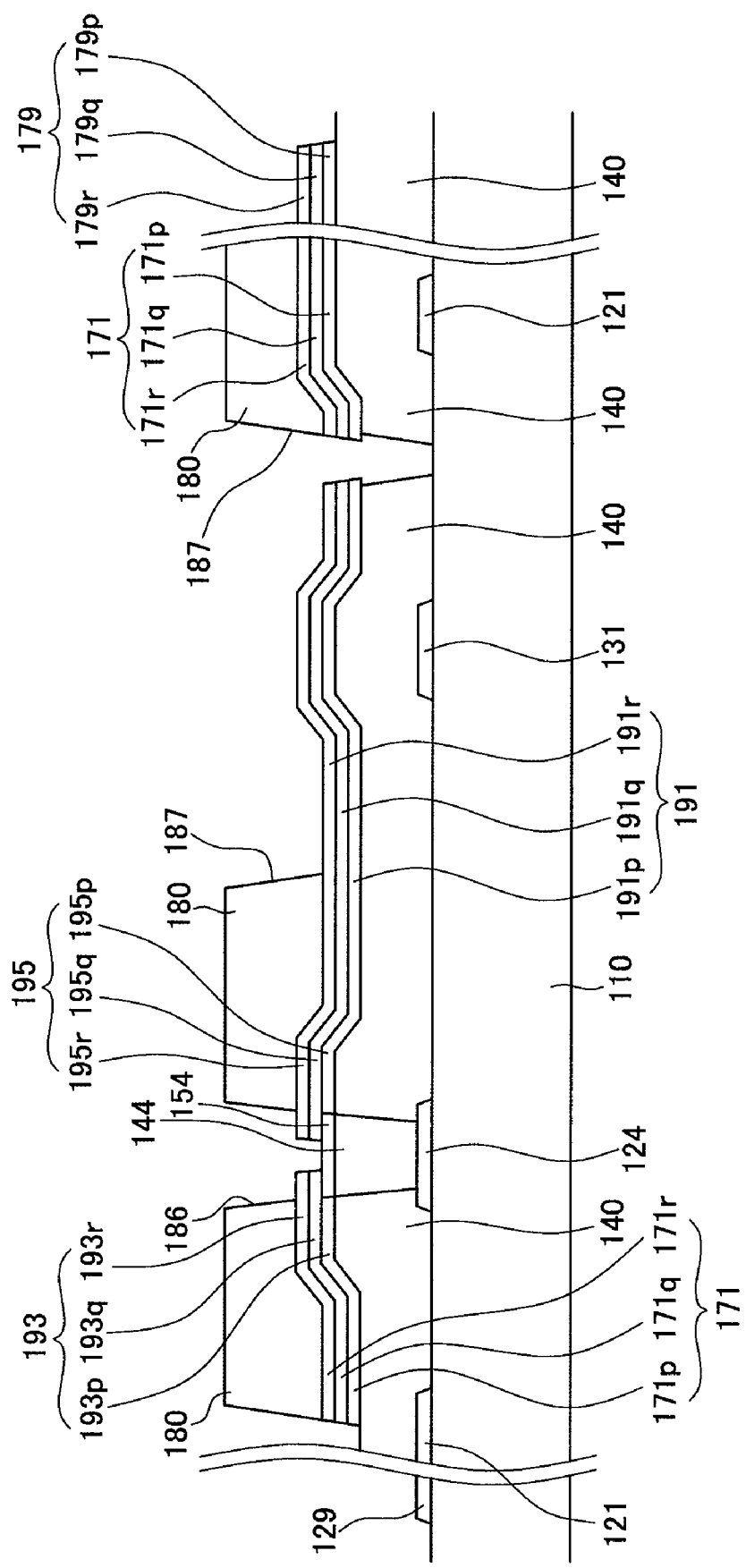
FIG. 29 is a sectional view of the thin film transistor array panel shown in FIG. 28 taken along the line XXIX-XXIX.
Figure 30:
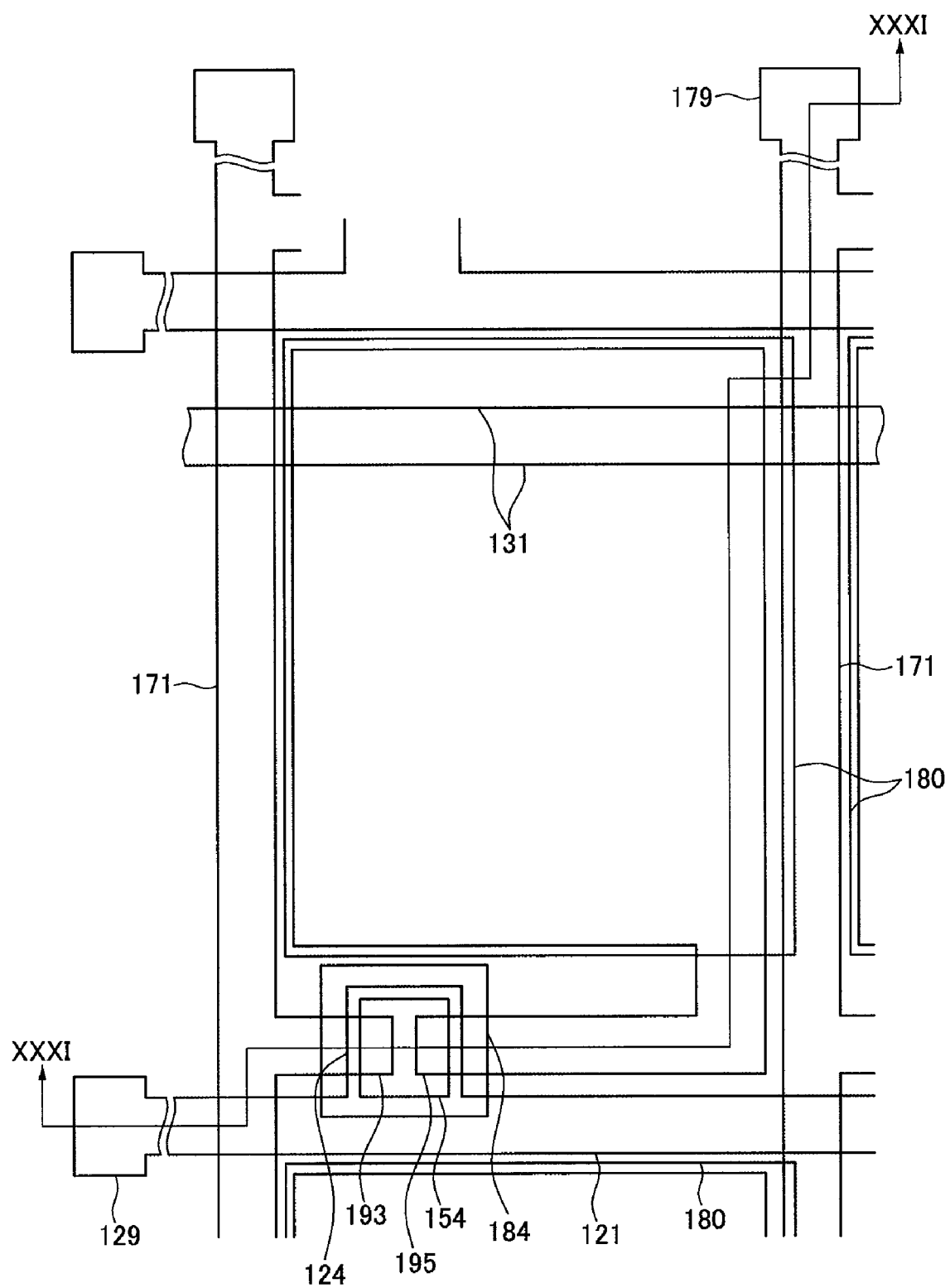
Figure 31:
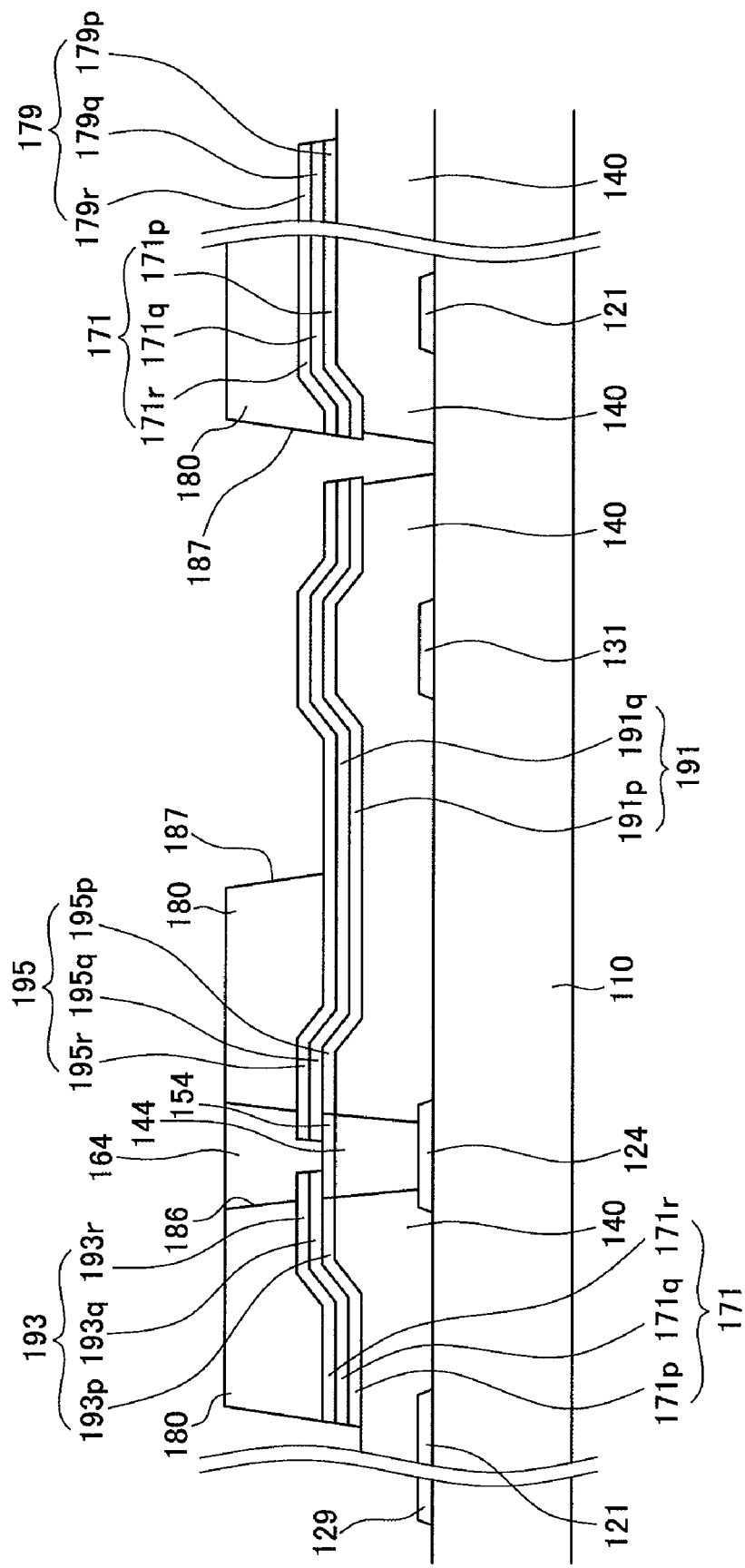
FIG. 31 is a sectional view of the thin film transistor array panel shown in FIG. 30 taken along the line XXXI-XXXI.

FIG. 20, FIG. 23, FIG. 28, and FIG. 30 are layout views sequentially illustrating a method of manufacturing the thin film transistor array panel shown in FIG. 18 and FIG. 19 according to another embodiment of the present invention, FIG. 21 is a sectional view of the thin film transistor array panel shown in FIG. 20 taken along the line XXI-XXI, FIG. 22 are sectional views sequentially illustrating a method of manufacturing the thin film transistor array panel shown in FIG. 20 and FIG. 21, FIG. 24 is a sectional view of the thin film transistor array panel shown in FIG. 23 taken along the line XXIV-XXIV, FIG. 25 to FIG. 27 are sectional views sequentially illustrating a method of manufacturing the thin film transistor array panel shown in FIG. 23 and FIG. 24, FIG. 29 is a sectional view of the thin film transistor array panel shown in FIG. 28 taken along the line XXIX-XXIX, and FIG. 31 is a sectional view of the thin film transistor array panel shown in FIG. 30 taken along the line XXXI-XXXI.

Firstly, a metal layer is deposited on a substrate 110 and patterned by photolithography to form a plurality of gate lines 121 including a plurality of gate electrodes 124 and end portions 129, and a plurality of storage electrode lines 131, as shown in FIG. 20 and FIG. 21.

Next, an interlayer insulating layer 140 is deposited on the substrate, and a lower conducting layer 170$p$, a middle conducting layer 170$q$, and an upper conducting layer 170$r$ are sequentially deposited on the interlayer insulating layer 140, as shown in FIG. 22. Here, the lower conducting layer 170$p$, the middle conducting layer 170$q$, and the upper conducting layer 170$r$ are made of molybdenum, ITO, and chromium, respectively.

A photosensitive film 40 is coated on the conducting layer 170$r$ and is patterned.

The upper conducting layer 170$r$, the middle conducting layer 170$q$, and the lower conducting layer 170$p$ are sequentially etched using the photosensitive film 40 as a mask to form a plurality of data lines 171 having a plurality of lower data lines 171$p$ including a plurality of lower source electrodes 193$p$ and lower end portions 179$p$, a plurality of middle data lines 171$q$ including a plurality of middle source electrodes 173$q$ and middle end portions 179$q$, and a plurality of upper data lines 171$r$ including a plurality of upper source electrodes 173$r$ and upper end portions 179$r$, and a plurality of pixel electrodes 191 having a plurality of lower pixel electrodes 191$p$ and lower drain electrodes 175$p$, a plurality of middle pixel electrodes 191$q$ and middle drain electrodes 175$q$, and a plurality of upper pixel electrodes 191$r$ and upper drain electrodes 175$r$, as shown in FIG. 23 and FIG. 24. Here, the lower conducting layer 170$p$, the middle conducting layer 170$q$, and the upper conducting layer 170$r$ made of molybdenum, ITO, and chromium, respectively, have different etching ratios, so they are wet-etched using different etchants such that the upper conducting layer 170$r$ is wet-etched using an etchant for chromium, the middle conducting layer 170$q$ is wet-etched using an etchant for ITO, and the lower conducting layer 170$p$ is wet-etched using an etchant for molybdenum.

Next, the interlayer insulating layer 140 is etched using the data lines 171 and the pixel electrodes 191 as a mask, as shown in FIG. 25. Here, the etching of the interlayer insulating layer 140 may preferably be dry-etching.

During the etching of the interlayer insulating layer 140, the interlayer insulating layer 140 is over-etched underneath portions between the source electrodes 193 and the drain electrodes 195 to form the openings 146 in the interlayer insulating layer 140 having a larger width than the portions between the source electrodes 193 and the drain electrodes 195.

Next, an organic layer is coated on the upper data lines 171$r$ and the upper pixel electrodes 191$r$ and is patterned to form a bank 180 having a plurality of openings 186 exposing the openings 146, and openings 187 exposing the pixel electrodes 191, as shown in FIG. 26.

Next, an insulating solution is dripped in the openings 146 of the interlayer insulating layer 140 through the openings 186 of the bank 180 to form a plurality of gate insulators 144.

The lower data lines 171$p$ and the lower drain electrodes 195$p$ are over-etched using the etchant for molybdenum, as shown in FIG. 27. Here, the over-etching may be performed by continuation of the etching in the etching of the lower conducting layer 170$p$ or by additional etching after the etching of the lower conducting layer 170$p$. As shown in FIG. 27, an interval between the lower source electrode 193$p$ and the lower drain electrode 195$p$ is wider than that between the middle source electrode 193$q$ and the middle drain electrode 195$q$ or that between the upper source electrode 193$r$ and the upper drain electrode 195$r$.

Next, an organic semiconductor solution is dripped through the openings 186 of the bank 180 to form a plurality of organic semiconductors 154 disposed between the lower source electrodes 193$p$ and the lower drain electrodes 195$p$, as shown in FIG. 28 and FIG. 29.

Then, an insulating solution is dripped in the openings 186 of the bank 180 to form a plurality of passivation layers 164 as shown in FIG. 30 and FIG. 31.

Next, the upper pixel electrodes 191$r$ are etched by the etchant for chromium using the bank 180 as a mask to expose the middle pixel electrodes 191$q$, as shown in FIG. 18 and FIG. 19.

As described above, the thin film transistor array panel according to the present embodiment includes the organic semiconductors that contact the source electrodes and the drain electrodes in the upper portion in a structure that is referred to as a "top contact structure", and the organic semiconductor may be prevented from being damaged due to chemical solution or plasma generated in the etching process of the source electrode and the drain electrode by formation of the organic semiconductor after the formation of the source electrode and the drain electrode in the manufacturing method of the thin film transistor array panel according to the present embodiment. In addition, the channel of the organic thin film transistor may be uniformly adjusted and the thickness of the organic semiconductor may be easily adjusted by the top contact structure. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a gate electrode;
   an insulating layer formed on the gate electrode;
   an organic semiconductor formed on the insulating layer;
   a source electrode and a drain electrode formed on the organic semiconductor and disposed opposite each other; and
   a pixel electrode connected to the drain electrode,
   wherein the source electrode and the drain electrode include a first source electrode and a first drain electrode disposed opposite each other with a first interval therebetween and a second source electrode and a second drain electrode disposed opposite each other with a second interval therebetween,
   wherein the first source electrode and the first drain electrode are disposed on the second source electrode and the second drain electrode, and
   wherein the second interval is longer than the first interval.

2. The thin film transistor array panel of claim 1, wherein the organic semiconductor is disposed between the second source electrode and the second drain electrode.

3. The thin film transistor array panel of claim 2, wherein the second source electrode and the second drain electrode are over-etched as compared with the first source electrode and the first drain electrode.

4. The thin film transistor array panel of claim 1, further comprising:
   a bank formed on the first source electrode and the first drain electrode and having a first opening exposing the organic semiconductor.

5. The thin film transistor array panel of claim 4, further comprising:
a passivation layer disposed in the first opening.

6. The thin film transistor array panel of claim 4, further comprising:
a gate line connected to the gate electrode;
a data line connected to the source electrode; and
an organic layer having substantially the same planar shape as the data line, the source electrode, and the drain electrode, and disposed between the bank and the source electrode, and between the bank and the drain electrode.

7. The thin film transistor array panel of claim 1, wherein the insulating layer has a second opening exposing the gate electrode, and further comprising: a gate insulator formed in the second opening.

8. The thin film transistor array panel of claim 1, wherein the first source electrode and the first drain electrode include ITO, and the second source electrode and the second drain electrode include a metal.

9. The thin film transistor array panel of claim 8, further comprising:
a third source electrode and a third drain electrode formed on the first source electrode and the first drain electrode, and
wherein the third source electrode and the third drain electrode include a metal having a different etching ratio from that included in the second source electrode and the second drain electrode.

10. The thin film transistor array panel of claim 9, wherein the second source electrode and the second drain electrode include molybdenum, and the third source electrode and the third drain electrode include chromium.

* * * * *